United States Patent
Feiweier

(10) Patent No.: US 9,417,304 B2
(45) Date of Patent: Aug. 16, 2016

(54) METHOD AND MAGNETIC RESONANCE SYSTEM TO ACQUIRE MR DATA WITH DIFFUSION INFORMATION

(71) Applicant: Thorsten Feiweier, Poxdorf (DE)

(72) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 449 days.

(21) Appl. No.: 14/043,995

(22) Filed: Oct. 2, 2013

(65) Prior Publication Data

US 2014/0091797 A1 Apr. 3, 2014

(30) Foreign Application Priority Data

Oct. 2, 2012 (DE) .................. 10 2012 217 992

(51) Int. Cl.
*G01V 3/00* (2006.01)
*G01R 33/54* (2006.01)
*G01R 33/563* (2006.01)

(52) U.S. Cl.
CPC .......... *G01R 33/54* (2013.01); *G01R 33/56341* (2013.01)

(58) Field of Classification Search
USPC ......................................................... 324/309
See application file for complete search history.

(56) References Cited

U.S. PATENT DOCUMENTS

| | | | |
|---|---|---|---|
| 5,560,360 A | 10/1996 | Filler et al. | |
| 6,265,872 B1 * | 7/2001 | Heid | G01R 33/56341 324/307 |
| 6,445,184 B1 | 9/2002 | Tanttu | |
| 8,947,085 B2 * | 2/2015 | Feiweier | G01R 33/56341 324/309 |
| 2004/0071324 A1 | 4/2004 | Norris et al. | |
| 2007/0167732 A1 | 7/2007 | Zwanger | |
| 2010/0277169 A1 * | 11/2010 | Feiweier | G01R 33/56341 324/307 |
| 2014/0232396 A1 * | 8/2014 | Grodzki | G01R 33/543 324/309 |
| 2015/0084629 A1 * | 3/2015 | Porter | G01R 33/54 324/309 |
| 2015/0160317 A1 * | 6/2015 | Grodzki | G01R 33/543 702/57 |

OTHER PUBLICATIONS

Stejskal et al., "Spin Diffusion Measurements: Spin Echoes in the Presence of a Time-Dependent Field Gradient," The Journal of Chemical Physics, vol. 42, No. 1 (1965), pp. 288-292.
Heid, "Eddy Current-Nulled Diffusion Weighting," Proc. Intl. Soc. Mag. Reson. Med., vol. 8 (2000), p. 799.
Steidle et al., "Echoplanar Diffusion Tensor Imaging of the Lower Leg Musculature Using Eddy Current Nulled Stimulated Echo Preparation," Magnetic Resonance in Medicine, vol. 55 (2006), pp. 541-548.

(Continued)

*Primary Examiner* — Rodney Fuller
(74) *Attorney, Agent, or Firm* — Schiff Hardin LLP

(57) ABSTRACT

In the acquisition of MR data with diffusion information nuclear spins in a volume segment are excited with radiation of a diffusion coding module and a subsequent diffusion decoding module, and at least one RF pulse is radiated after the excitation, and the MR data are read out. At least one of a time period that defines a time interval between a point in time at which the spin echo condition is satisfied, and the echo time, a first time interval that defines a minimum time interval between the end of the diffusion coding module and the start of the diffusion decoding module, and a second time interval that defines a minimum time interval between the end of the excitation module, and the start of the diffusion coding module, and a third time interval that defines a minimum time interval between the end of the diffusion coding module and the start of the readout of the MR data, is set.

24 Claims, 7 Drawing Sheets

(56) References Cited

OTHER PUBLICATIONS

Feiweier et al., "Bipolar Diffusion Encoding with Implicit Spoiling of Undesired Coherence Pathways," Proc. Intl. Soc. Mag. Reson. Med., vol. 19 (2011, p. 178.

Morelli et al., "Evaluation of a Modified Stejskal-Tanner Diffusion Encoding Scheme, Permitting a Marked Reduction in TE, in Diffusion-Weighted Imaging of Stroke Patients at 3 T," Investigative Radiology, vol. 45, No. 1 (2010), pp. 29-35.

Feiweier, "A Comprehensive Framework for Optimizing Diffusion Encoding with N>=Refocusing Pulses," (2012).

* cited by examiner a)

b)

c)

d)

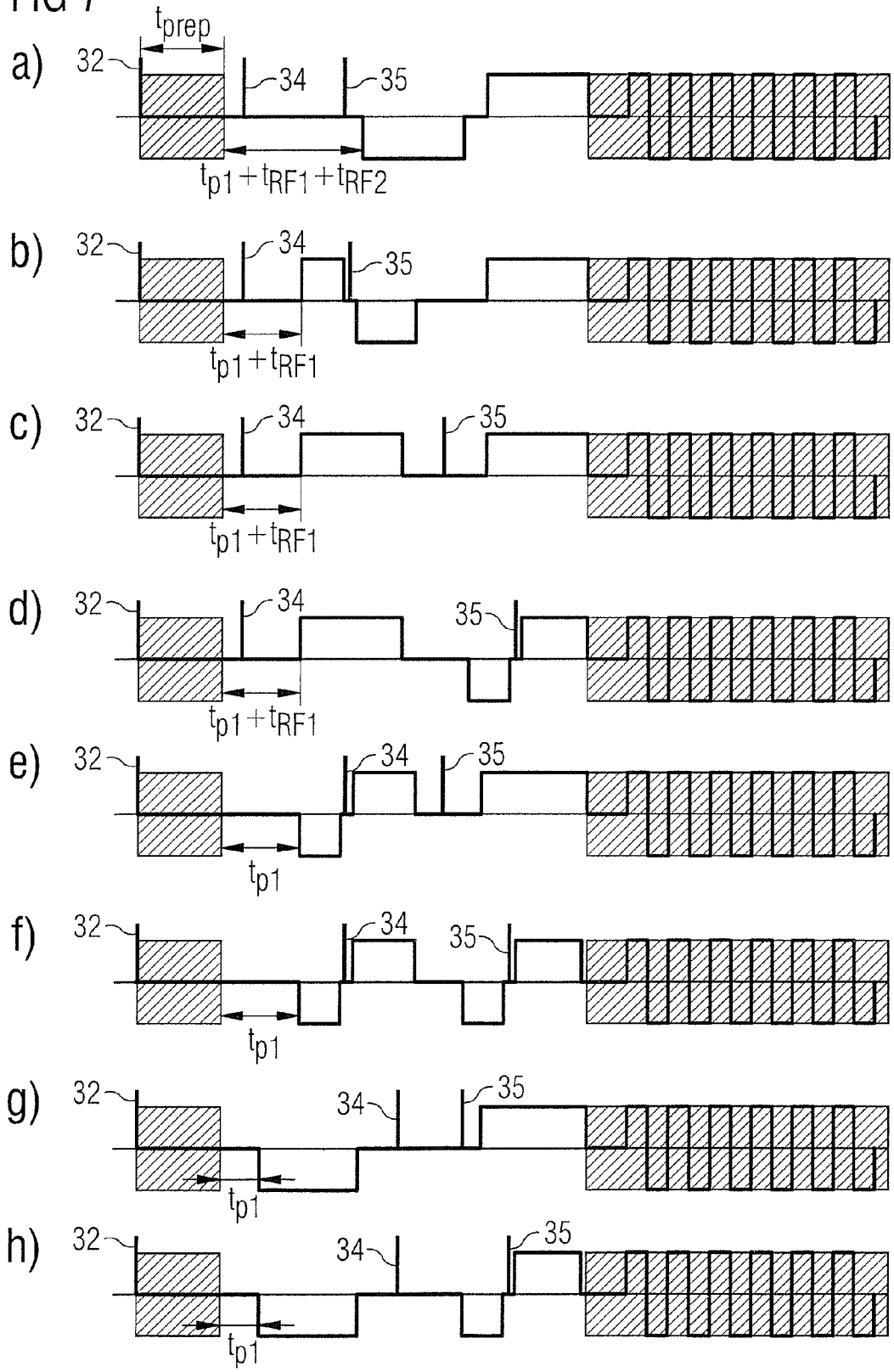

METHOD AND MAGNETIC RESONANCE SYSTEM TO ACQUIRE MR DATA WITH DIFFUSION INFORMATION

BACKGROUND OF THE INVENTION

1. Field of the Invention

The present invention concerns a method and a magnetic resonance system in order to acquire MR data with diffusion information in a volume segment of an examination subject.

2. Description of the Prior Art

In order to generate a diffusion contrast in MR images, various gradient switching schemes have been developed.

"Spin Diffusion Measurements: Spin Echoes in the Presence of a Time-Dependent Filed Gradient", E. Stejskal, J. Tanner, The Journal of Chemical Physics, Vol. 42, Nr. 1, 1965, Pages 288-292 describes such a method in which the spin echo condition is satisfied at the point in time of the acquisition of the k-space center and a defined wait time is to be maintained before and after the RF refocusing pulse.

"Evaluation of a Modified Stejskal-Tanner Diffusion Encoding Scheme, Permitting a Marked Reduction in TE, in Diffusion-Weighted Imaging of Stroke Patients at 3 T", J. Morelli et al., Investigative Radiology, Vol. 45, Nr. 1, 2010, Pages 29-35, likewise discloses a method in which the spin echo condition is satisfied at the point in time of the acquisition of the k-space center, with a non-variable diffusion time, wherein a parameter range of measurement protocols is limited to cases which are compatible with a diffusion coding before and after the refocusing pulse.

"Echoplanar Diffusion Tensor Imaging of the Lower Leg Musculature Using Eddy Current Nulled Stimulated Echo Preparation", G. Steidle, F. Schick, Magnetic Resonance in Medicine 55, 2006, Pages 541-548, describes a method in which a stimulated echo condition is satisfied at the point in time of the acquisition of the k-space center and a defined wait time is to be maintained before and after the RF store/restore pulse.

"Eddy Current-Nulled Diffusion Weighting", O. Heid, Proc. Intl. Soc. Mag. Reson. Med. 8, 2000, Page 799, describes such a method in which a double spin echo condition is satisfied at the point in time of the acquisition of the k-space center, with a non-variable diffusion time, wherein a parameter range of measurement protocols is limited to cases in which four gradient pulses with identical amplitude and identical ramp durations are used.

"Bipolar Diffusion Encoding with Implicit Spoiling of Undesired Coherence Pathways", T. Feiweier, Proc. Intl. Soc. Mag. Reson. Med. 19, 2011, Page 178, likewise describes a method with a non-variable diffusion time, wherein a parameter range of measurement protocols is limited to cases in which four gradient pulses with identical amplitude and identical ramp durations are used.

However, these methods according to the prior art have specific disadvantages. There are either limitations with regard to the minimum realizable echo time, or the establishments of a coding time δ and a diffusion time Δ are inflexible, or a parameter range of measurement protocols with which the resolution and the field of view are determined (and which leads to a valid chronological workflow) is very limited.

SUMMARY OF THE INVENTION

In view of the above, an object of the present invention is to determine MR data with diffusion information with different gradient switching schemes and to ensure an optimal chronological workflow, so that the aforementioned limitations according to the prior art are overcome.

The present invention provides a method to acquire MR data with diffusion information in a predetermined volume segment of an examination subject using a magnetic resonance system that includes the following steps:

Excite the volume segment with an excitation module. The volume segment is thereby excited with an RF excitation pulse in order to generate a spin coherence in the volume segment.

Radiate a diffusion coding module and a subsequent diffusion decoding module. A first gradient pulse curve is thereby radiated in the form of the diffusion coding module. A second gradient pulse curve that balances or cancels the phase change generated by the first part given unmoving spins is then radiated in the form of the subsequent diffusion decoding module. Depending on the embodiment, each of these gradient pulse curves (depending on the position of radiated RF pulses) can be either a single gradient pulse or two gradient pulses with opposite polarity.

Radiate one or more RF pulses after the excitation module. These one or more RF pulses are generated in addition to the RF excitation pulse and serve for refocusing, for example.

Read out the MR data.

Moreover, the method according to the invention operates with at least one of the following time parameters:

A time period $t_{shift}$ which defines the time interval between a point in time at which the spin echo condition is satisfied and the echo time of the respective method. The spin echo condition is satisfied when the sum of the dephasing times corresponds precisely to the sum of the rephasing times. The dephasing time thereby begins with the point in time of the excitation and changes between a dephasing and rephasing with each refocusing pulse. The time interval between a storage pulse and a restoring pulse is thereby not counted as well, wherein a switch between a dephasing and a rephasing likewise takes place with a restoring pulse.

A first time interval $t_F$ by which a minimum possible time interval between the end of the diffusion coding module and the start of the diffusion decoding module is extended. The minimum possible time interval thereby depends on how many RF pulses are radiated between the end of the diffusion coding module and the start of the diffusion decoding module. If no RF pulse is radiated between the diffusion coding module and the diffusion decoding module, the minimum possible interval is 0 s. In the other case, the minimum possible interval amounts to the sum of the durations of the application modules of the radiated RF pulses.

A second time interval $t_{P1}$ by which a minimum possible time interval between the end of the excitation module and the start of the diffusion coding module is extended. The minimum time interval again depends on how many RF pulses are radiated between the end of the excitation module and the start of the diffusion coding module. If no RF pulse is radiated between the excitation module and the start of the diffusion coding module, the minimum possible interval is 0 s. In the other case, the minimum possible interval amounts to the sum of the durations of the application modules of the radiated RF pulses.

A third time interval $t_{P2}$ by which a minimum possible time interval between the end of the diffusion decoding module and the start of the readout of the MR data is extended. In this case, the minimum possible time interval is also dependent on how many RF pulses are generated between the end of the diffusion decoding module and the start of the readout of the MR data. If no RF pulse is radiated during this time, the minimum possible interval is 0 s (zero seconds). In contrast to this, if one or more RF pulses are radiated after the end of the diffusion decoding module and the start of the readout, the minimum possible interval amounts to the sum of the durations of the application modules of these radiated RF pulses.

The method according to the invention operates such that MR data are acquired with diffusion information such that at least one of the previously stated parameters is different than 0 s. A point in time at which the one or more RF pulses is thereby determined depending on these one or more parameters which are different than 0 s.

It is noted that the set of previously described parameters with which the method according to the invention operates depends on the corresponding embodiment. Parameters which are not used by the corresponding embodiment or, respectively, which have a value of 0 s are not defined for the corresponding embodiment. In other words: with the present invention every embodiment is protected given which one, two, three or four of the previously described parameters is or, respectively, are defined and then used to acquire the MR data with diffusion information.

Through the introduction of the previously described parameters, various diffusion coding schemes can be used more flexibly, so the limitations present according to the prior art are overcome.

According to the invention, it is possible to define the first time interval with the aid of the coding time and diffusion time known according to the prior art. This means that the coding time and the diffusion time are defined instead of the first time interval. The coding time $\delta$ thereby corresponds to the duration of the diffusion coding module. The diffusion time $\Delta$ corresponds to a duration from the beginning of the diffusion coding module to the beginning of the diffusion coding module. The first time interval tF can now be determined as a difference of the diffusion time $\Delta$ minus the coding time $\delta$, wherein RF pulses radiated in this time are to be taken into account, however. For example, the first time interval $t_F$ can be determined via the following Equation:

$$t_F = \Delta - \delta - X$$

wherein X is the sum of the durations of the application modules of RF pulses which are radiated during the diffusion time $\Delta$.

According to the invention, it is also possible to define a sum of the second time interval $t_{P1}$ and the third time interval $t_{P2}$ with the aid of the coding time $\delta$ and the diffusion time $\Delta$, as it is defined by the following Equation (G1):

$$t_{P1} + t_{P2} = TE - t_{prep} - t_{adc} - \Delta - \delta \quad (G1),$$

wherein TE is the echo time of the method, $t_{prep}$ corresponds to the duration of the excitation module, and $t_{adc}$ corresponds to a duration which begins with the beginning of the readout module and ends at the end of the echo time. Here possible radiated RF pulses must also be taken into account, as is the case in the following equation:

$$t_{P1} + t_{P2} = TE - t_{prep} - t_{adc} - \Delta - \delta + X - T_{RF}$$

wherein $T_{RF}$ is a sum of durations of application modules of RF pulses of the at least one RF pulse.

By the specification of the coding time $\delta$ and the diffusion time $\Delta$, this embodiment according to the invention offers another possibility to define the first time interval $t_F$ which applies to the entire invention.

According to the prior art, it is typical that the diffusion coding module begins directly after the excitation module and the data acquisition begins directly after the diffusion decoding module. By introducing the second and third time interval $t_{P1}$, $t_{P2}$, for example, it is now possible to modify the coding time $\delta$ and diffusion time $\Delta$ without the echo time TE thereby needing to be altered, such that the influence of the $T_2$ relaxation can be kept constant. For example, this enables examinations of the time dependency of the diffusion process, for example in order to review microscopic models.

It is noted that the introduction of the second time interval $t_{P1}$ does not correspond to a simple extension of the excitation module or, respectively, the time $t_{prep}$ since—via the introduction of $t_{P1}$—a refocusing pulse can be radiated between the excitation module and the diffusion coding module, while it is not possible to radiate a refocusing pulse during the time $t_{prep}$.

First Variant—Spin Echo

In the following, a first variant according to the invention is described which can also be designated as a spin echo. According to this variant, the at least one RF pulse which is radiated after the excitation module includes precisely one refocusing pulse (in particular with a flip angle of 180°). This refocusing pulse is radiated at a fourth time interval $t_R$ after the beginning of the excitation module, wherein this fourth time interval $t_R$ is dependent on the following parameters:
 the duration $t_{prep}$ of the excitation module,
 a duration $t_{RF}$ of an application module or, respectively, refocusing module for the refocusing pulse,
 the duration $t_{adc}$ which begins with the beginning of the readout module and ends at the end of the echo time TE of the method, and
 the echo time TE of the method.

Moreover, the fourth time interval is additionally dependent on at least one of the following parameters:
 the first time interval $t_F$,
 the second time interval $t_{P1}$ and
 the third time interval $t_{P2}$.

It is noted that this first variant includes both the embodiment in which the refocusing pulse lies between the diffusion coding module and the diffusion decoding module and the embodiment in which this is not the case. In particular given the embodiment in which the refocusing pulse (more precisely the application module of this refocusing pulse) lies between the diffusion coding module and the diffusion decoding module, a flexible combination of the first time interval $t_F$, the second time interval $t_{P1}$ and the third time interval $t_{P2}$, or the use of the time period $t_{shift}$ between the point in time of the spin echo condition and the echo time (together or without the first, second and third time interval), is advantageous in the acquisition of MR data with diffusion information according to the invention.

In the embodiment in which the refocusing pulse does not lie between the diffusion coding module and the diffusion decoding module, but rather essentially divides the diffusion coding module or the diffusion coding module, the use of each parameter ($t_{shift}$, $t_F$, $t_{P1}$, $t_{P2}$) according to the invention is advantageous on its own or in combination with one or more others of these parameters.

According to an embodiment of the first variant of the invention, the fourth time interval is set equal to half of the echo time TE if this corresponds to a valid time interval for the fourth time interval $t_R$. More precisely stated, the parameters ($t_{shift}$, $t_F$, $t_{P1}$, $t_{P2}$) used by the method are defined such that the above condition is satisfied. A diffusion duration $t_D$ is introduced to determine which time intervals are time intervals valid for the fourth time interval $t_R$, which diffusion duration $t_D$ can be determined via the following Equation (G2):

$$t_D = TE - t_{prep} - t_{P1} - t_F - t_{RF} t_{P2} t_{adc} \quad (G2)$$

Assuming this diffusion duration, the fourth time interval $t_R$ corresponds to a valid time interval if the fourth time interval satisfies one of the following inequalities (UG1) through (UG5):

$$t_{prep} + t_{RF}/2 \leq t_R \leq t_{prep} + t_{P1} + t_{RF}/2, \quad (UG1)$$

$$t_{prep} + t_{P1} + t_{RF}/2 \leq t_R \leq t_{prep} + t_{P1} + t_{RF}/2 + t_D/2 \quad (UG2)$$

$$t_{prep} + t_{P1} + t_{RF}/2 + t_D/2 \leq t_R \leq t_{prep} + t_{P1} + t_{RF}/2 + t_D/2 + t_F \quad (UG3)$$

$$t_{prep} + t_{P1} + t_{RF}/2 + t_D/2 + t_F \leq t_R \leq TE - t_{adc} - t_{RF}/2 - t_{P2} \quad (UG4)$$

$$t_{prep} + t_{P1} + t_{RF}/2 + t_D + t_F \leq t_R \leq TE - t_{adc} - t_{RF}/2 \quad (UG5).$$

According to these inequalities, the fourth time interval applies as a valid time interval when
- the refocusing pulse is before the diffusion coding module, or
- the refocusing pulse divides the diffusion coding module, or
- the refocusing pulse is between the diffusion coding module and the diffusion decoding module, or
- the refocusing pulse divides the diffusion coding module, or
- the refocusing pulse is after the diffusion decoding module but before the readout module.

It is sometimes not possible to determine the fourth time interval $t_R$ as a valid time interval equal to half of the echo time. In this case, the time period $t_{shift}$ can be worked with as an (additional) parameter so that the fourth time interval $t_R$ satisfies the following Equation (G3):

$$t_R = TE/2 - t_{shift} \quad (G3)$$

The parameters (first through third time interval) used by the method are thereby advantageously selected such that an optimally small absolute value can be determined for the time period $t_{shift}$, such that the fourth time interval $t_R$ determined in such a manner lies optimally close to the preferred solution $t_R = TE/2$.

Second Variant—Stimulated Echo

In the following, a second variant according to the invention is described which can also be designated as a stimulated echo. According to this variant, the at least one RF pulse includes a storing module and a restoring module which are radiated after the excitation module. An RF pulse with a flip angle of 90° is generated via the storing module. Via this first 90° pulse, the dephasing of the transversal magnetization that has heretofore been present due to the diffusion coding is converted into a longitudinal magnetization (and virtually stored). A 90° pulse is likewise generated by the restoring module which chronologically follows the storing module. This second 90° pulse again converts the (stored) longitudinal magnetization into a transverse magnetization so that the diffusion coding can subsequently occur. The first 90° pulse is radiated at a fourth time interval $t_{R1}$ after the beginning of the excitation module and the second 90° pulse is thereby radiated at a fifth time interval $t_{R2}$ after the beginning of the excitation module. The fourth time interval $t_{R1}$ and the fifth time interval $t_{R2}$ are dependent on the following parameters:
- the duration ($t_{prep}$) of the excitation module,
- a duration ($t_{RF1}$) of the storing module,
- a duration ($t_{RF2}$) of the restoring module,
- a duration ($t_{adc}$) which begins with the beginning of the readout module and ends at the end of the echo time (TE) of the method, and the echo time (TE) of the method.

Moreover, the fourth time interval $t_{R1}$ and the fifth time interval $t_{R2}$ are additionally dependent on at least one of the following parameters:
- the first time interval ($T_F$),
- the second time interval ($T_{P1}$),
- the third time interval ($T_{P2}$).

In the second variant, in particular a flexible combination of the first time interval $t_F$, the second time interval $t_{P1}$ and the third time interval $t_{P2}$, or the use of the time period $t_{shift}$ between the point in time of the spin echo condition and the echo time (together with or without the first, second and third time interval $t_F$, $t_{P1}$, $t_{P2}$), is advantageous in the acquisition of MR data with diffusion information according to the invention.

In the determination of the fourth time interval $t_{R1}$ and the fifth time interval $t_{R2}$ for the second variant, the following three rules are followed:

1. The absolute value B of the following Equation (G4) is minimized.

$$B = |(t_{prep} + t_{P1} + t_{RF1}/2) - (t_{adc} + t_{P2} + t_{RF2}/2)| \quad (G4)$$

2. The absolute value of the time period $t_{shift}$ is minimized.
3. The proportion of the first time interval $t_F$ which lies between the RF pulse of the storing module and the RF pulse of the restoring module is maximized.

According to the invention, it is also possible to determine the fourth time interval $t_{R1}$ and the fifth time interval $t_{R2}$ with a rule set which includes only one or only two of the rules stated in the preceding.

As a superordinate rule, the fourth time interval and the fifth time interval must each be valid time intervals, which is the case if the fourth time interval and the fifth time interval satisfy the following inequalities (UG7) through (UG9):

$$t_{R1} \geq t_{prep} + t_{P1} + t_D/2 + t_{RF1}/2 \quad (UG7)$$

$$t_{R2} \leq TE - t_{adc} - t_{P2} - t_D/2 - t_{RF2}/2 \quad (UG8)$$

$$t_{R2} - t_{RF2}/2 \geq t_{R1} + t_{RF1}/2 \quad (UG9).$$

In other words: the fourth time interval $t_{R1}$ and the fifth time interval $t_{R2}$ correspond to valid time intervals when both the storing module and the restoring module lie entirely in the time gap between the diffusion coding module and the diffusion decoding module, wherein the end of the storing module must lie before the beginning of the restoring module.

Third Variant—Double Spin Echo

In the following, a third variant according to the invention is described which can be designated as a double spin echo. According to this variant, the at least one RF pulse includes two refocusing pulses (in particular 180° pulses) which are radiated after the excitation module. The first refocusing pulse is thereby a radiated at a fourth time interval $t_{R1}$ after the beginning of the excitation module, and the second refocusing pulse is radiated at a fifth time interval $t_{R2}$ after the beginning of the excitation module. The fourth time interval and the fifth time interval are dependent on the following parameters:
- the duration ($t_{prep}$) of the excitation module,
- a duration ($t_{RF1}$) of a first application module or, respectively, refocusing module to generate the first refocusing pulse,
- a duration ($t_{RF2}$) of a second application module or, respectively, refocusing module to generate the second refocusing pulse, the duration ($t_{adc}$) which begins with the beginning of the readout module and ends at the end of the echo time (TE) of the method, and the echo time (TE) of the method.

Moreover, the fourth time interval and the fifth time interval are additionally dependent on at least one of the following parameters:

the first time interval $t_F$,
the second time interval $t_{P1}$ and
the third time interval $t_{P2}$.

According to a preferred embodiment of the third variant, the fourth time interval $t_{R1}$ and the fifth time interval $t_{R2}$ are determined such that they on the one hand satisfy the following Equation (G5) and on the other hand respectively correspond to a valid time interval.

$$t_{R2} - t_{R1} = (TE - t_{shift})/2 \tag{G5}$$

The fourth time interval $t_{R1}$ and the fifth time interval $t_{R2}$ thereby respectively correspond to a valid time interval if the refocusing module of the first refocusing pulse is before the refocusing module of the second refocusing pulse, and the fourth time interval $t_{R1}$ and the fifth time interval $t_{R2}$ satisfy one of the following inequalities (UG10 through UG21).

$$t_{R1} \geq t_{prep} + t_{RF1}/2 \text{ and } t_{R2} \leq t_{prep} + t_{P1} + t_{RF1} + t_{RF2}/2 \tag{UG10}$$

$$t_{prep} + t_{RF1}/2 \leq t_{R1} \leq t_{prep} + t_{P1} + t_{RF1}/2 \text{ and } t_{prep} + t_{P1} + t_{RF1} + t_{RF2}/2 < t_{R2} < t_{prep} + t_{P1} + t_{RF1} + t_D/2 + t_{RF2}/2 \tag{UG11}$$

$$t_{prep} + t_{RF1}/2 \leq t_{R1} \leq t_{prep} + t_{P1} + t_{RF1}/2 \text{ and } t_{prep} + t_{P1} + t_{RF1} + t_D/2 + t_{RF2}/2 \leq t_{R2} \leq t_{prep} + t_{P1} + t_{RF1} + t_D/2 + t_F + t_{RF2}/2 \tag{UG12}$$

$$t_{prep} + t_{RF1}/2 \leq t_{R1} \leq t_{prep} + t_{P1} + t_{RF1}/2 \text{ and } t_{prep} + t_{P1} + t_{RF1} + t_D/2 + t_F + t_{RF2}/2 < t_{R2} < t_{prep} + t_{P1} + t_{RF1} + t_D + t_F + t_{RF2}/2 \tag{UG13}$$

$$t_{prep} + t_{RF1}/2 \leq t_{R1} \leq t_{prep} + t_{P1} + t_{RF1}/2 \text{ and } t_{prep} + t_{P1} + t_{RF1} + t_D + t_F + t_{RF2}/2 \leq t_{R2} \leq TE - t_{adc} + t_{RF2}/2 \tag{UG14}$$

$$t_{prep} + t_{P1} + t_{RF1}/2 < t_{R1} < t_{prep} + t_{P1} + t_D/2 + t_{RF1}/2 \text{ and } t_{prep} + t_{P1} + t_D/2 + t_{RF1} + t_{RF2}/2 \leq t_{R2} \leq t_{prep} + t_{P1} + t_D/2 + t_{RF1} + t_F + t_{RF2}/2 \tag{UG15}$$

$$t_{prep} + t_{P1} + t_{RF1}/2 < t_{R1} < t_{prep} + t_{P1} + t_D/2 + t_{RF1}/2 \text{ and } t_{prep} + t_{P1} + t_D/2 + t_{RF1} + t_F + t_{RF2}/2 < t_{R2} < t_{prep} + t_{P1} + t_D + t_{RF1} + t_F + t_{RF2}/2 \tag{UG16}$$

$$t_{prep} + t_{P1} + t_{RF1}/2 < t_{R1} < t_{prep} + t_{P1} + t_D/2 + t_{RF1}/2 \text{ and } t_{prep} + t_{P1} + t_{RF1} + t_D + t_F + t_{RF2}/2 \leq t_{R2} \leq TE - t_{adc} + t_{RF2}/2 \tag{UG17}$$

$$t_{prep} + t_{P1} + t_D/2 + t_{RF1}/2 \leq t_{R1} \text{ and } t_{R2} \leq t_{prep} + t_{P1} + t_D/2 + t_{RF1} + t_F + t_{RF2}/2 \tag{UG18}$$

$$t_{prep} + t_{P1} + t_D/2 + t_{RF1}/2 \leq t_{R1} \leq t_{prep} + t_{P1} + t_D/2 + t_F + t_{RF1}/2 \text{ and } t_{prep} + t_{P1} + t_D/2 + t_{RF1} + t_F + t_{RF2}/2 < t_{R2} < t_{prep} + t_{P1} + t_D + t_{RF1} + t_F + t_{RF2}/2 \tag{UG19}$$

$$t_{prep} + t_{P1} + t_D/2 + t_{RF1}/2 \leq t_{R1} \leq t_{prep} + t_{P1} + t_D/2 + t_F + t_{RF1}/2 \text{ and } t_{prep} + t_{P1} + t_D + t_{RF1} + t_F + t_{RF2}/2 \leq t_{R2} \leq TE - t_{adc} - t_{RF2}/2 \tag{UG20}$$

and $$t_{prep} + t_{P1} + t_D/2 + t_F + t_{RF1}/2 < t_{R1} < t_{prep} + t_{P1} + t_D + t_F + t_{RF1} \text{ and } t_{prep} + t_{P1} + t_D + t_{RF1} + t_F + t_{RF2}/2 \leq t_{R2} \leq TE - t_{adc} + t_{RF2}/2 \tag{UG21}$$

wherein $t_D$ is the diffusion duration that can be determined via the described Equation (G6).

$$t_D = TE - t_{prep} - t_{P1} + t_{RF1} + t_F + t_{RF2} + t_{P2} + t_{adc} \tag{G6}$$

The fact described with inequalities (UG10-UG21) can also be described graphically. The fourth time interval $t_{R1}$ and the fifth time interval $t_{R2}$ then correspond to valid time intervals if the following conditions are satisfied:

The first refocusing pulse is before the diffusion coding module but after the excitation module, or divides the diffusion coding module or lies between the diffusion coding module and the diffusion decoding module or divides the diffusion decoding module.

The second refocusing pulse is before the diffusion coding module or divides the diffusion coding module or lies between the diffusion coding module and the diffusion decoding module or is after the diffusion decoding module but before the readout module.

The first refocusing pulse and second refocusing pulse do not both divide the same diffusion coding module or diffusion decoding module.

The fourth and fifth time interval are preferably determined such that the time period $t_{shift}$ between the spin echo condition point in time and the echo time has an optimally small value. This is optimally the case when the time period $t_{shift}$ amounts to 0 s.

If there are valid solutions with a small value for $t_{shift}$ (ideally $t_{shift}=0$), among the valid solutions it can be helpful to identify those cases that satisfy an additional optimization condition. For example, this optimization condition can be that the fourth time interval $t_{R1}$ is determined such that eddy current fields occurring due to the diffusion coding module and/or due to the diffusion decoding module are optimally small. These eddy current fields should have a minimum influence at least during the readout of the MR data.

Independent of this optimization condition, it can be meaningful to limit $t_{shift}$ (for example $|t_{shift}| \leq t_{adc}/2$). The greater the absolute value of $t_{shift}$ (accordingly the greater the deviation of the spin echo condition), the more that unwanted dephasing influences can negatively affect the image quality.

For example, the eddy currents $B_{EC}(TE)$ can be determined depending on the echo time TE, according to the following Equation (G7):

$$B_{EC}(TE) = \sum_{i=1}^{n} (\alpha G_i (\exp(-\lambda(TE - T_i)) - \exp(-\lambda(TE - T_i + t_i)))). \tag{G7}$$

wherein n is the number of gradients of the diffusion coding module and the diffusion decoding module; $G_i$ is an amplitude of the i-th gradient of the diffusion coding module and the diffusion decoding module; $T_i$ is the start point in time of the i-th gradient of the diffusion coding module and the diffusion decoding module; $t_i$ is the duration of the i-th gradient of the diffusion coding module and the diffusion decoding module; and $\alpha$ and $\lambda$ are scaling constants. The eddy current fields are minimized in that the magnitude of $B_{EC}(TE)$ is minimized.

In other words (in particular via a corresponding selection of at least one of the parameters $t_{shift}, t_F, t_{P1}, t_{P2}$), a fourth time interval $t_{R1}$ (and therefore also a fifth time interval $t_{R2}$) is sought so that these two time intervals correspond to valid time intervals and the eddy current fields (and the magnitude of the time period $t_{shift}$) are additionally minimized.

An additional optimization condition—which is advantageously to be complied with in addition to the requirement that the value of the time period $t_{shift}$ is kept as small as possible—is that the gradients of the diffusion coding module and the diffusion decoding module generate a predetermined dephasing of all coherence paths, with the exception of a desired double spin echo path.

In other words, the fourth and fifth time interval are primarily not defined in order to reduce eddy current fields; rather, instead of this these two time intervals $t_{R1}$, $t_{R2}$ are optimized such that additional spoiler gradients can be omitted. These spoiler gradients would otherwise need to be used in order to suppress FID signal paths or spin echo signal paths, for example.

According to the invention, the second time interval $t_{P1}$ or the third time interval $t_{P2}$ can be predetermined and therefore not available for optimization (for example of the time period $t_{shift}$).

Embodiments of All Variants

The diffusion coding module includes at least one diffusion gradient pulse, and the diffusion decoding module includes at least one diffusion gradient pulse. Each gradient pulse includes a ramp, and the number of ramps in the diffusion coding module can be different from the number of ramps in the diffusion decoding module, depending on which of the two modules of RF pulses are divided. Moreover, the ramps can have a different duration (for example given very short gradient pulses). For this purpose, i is selected so that the moment of the at least one diffusion gradient pulse of the diffusion coding module corresponds in its absolute value to the moment of the at least one diffusion gradient pulse of the diffusion decoding module in that corresponding measures are taken in which, for example, at least one of the parameters $t_{shift}$, $t_F$, $t_{P1}$, $t_{P2}$ is set accordingly.

In the event that the moment of the at least one diffusion gradient pulse of the diffusion coding module corresponds in terms of its absolute value to the moment of the at least one diffusion gradient pulse of the diffusion decoding module, with one procedure or multiple procedures listed in the following it can be ensured that the two moments at least approximate one another in terms of their absolute value:

The amplitude of the at least one diffusion gradient pulse of the diffusion coding module and/or the amplitude of the at least one diffusion gradient pulse of the diffusion decoding module is multiplied by a factor. The previously greater moment can thereby be reduced and/or the previously smaller moment can thereby be increased.

The duration of the diffusion coding module is extended or shortened, wherein the first time interval $t_F$ is set accordingly. The diffusion time $\Delta$ can therefore advantageously be maintained.

The duration of the diffusion decoding module is extended or shortened, wherein the third time interval $t_{P2}$ is set accordingly. The diffusion time $\Delta$ can therefore also be advantageously maintained.

The duration of the diffusion decoding module is extended or shortened, wherein the second time interval $t_{P1}$ and the third time interval $t_{P2}$ are set accordingly. The diffusion time $\Delta$ can therefore also be advantageously maintained.

In that the duration of the diffusion coding module or, respectively, diffusion decoding module is extended/shortened, the absolute value of the gradient moment of the corresponding module is increased/reduced.

The measures are advantageously only implemented after the determination of the parameters, for example $t_{prep}$, $t_{adc}$, TE, $t_R$, $t_{R1}$, $t_{R2}$, $t_{RF}$, $t_{RF1}$, $t_{RF2}$, $\delta$, $\Delta$, $t_F$, $t_{P1}$, $t_{P2}$, $t_{shift}$.

This has the advantage that the determination of the parameters (i.e. the determination according to the invention of the sequence to acquire the MR data with diffusion information) can be implemented with simplifying conditions (for example a ramp duration of 0 s), which simplifies the determination. Only subsequently are the measures taken in order to match the moments of the diffusion coding and diffusion decoding.

Determination of the Parameters

According to the prior art, to determine the chronological workflow of sequences for the acquisition of diffusion-weighted MR images assuming an excitation point in time (point in time at which the RF excitation pulse is radiated) and the echo time TE, the point in time of the radiation of the RF pulse is determined (given spin echo) or the time interval of the two RF pulses is determined (given double spin echo). Boundary conditions for the duration and the time interval of the gradient pulses for diffusion coding (given spin eco) or for the point in time of the radiation of one of the RF pulses (given double spin echo) directly result from this. The degrees of freedom for the design of the chronological sequence workflow (in particular the permissible value range for $\delta$ and $\Delta$) are therefore markedly limited.

In contrast to this, according to the invention boundary conditions for the duration of the diffusion coding module, the duration of the diffusion decoding module and the time interval between the end of the diffusion coding module and the beginning of the diffusion coding module are established in all three variants (spin echo, stimulated echo and double spin echo) based on the excitation point in time and the echo time. Starting from these boundary conditions, the at least one parameter is then determined in order to satisfy a determined optimization criterion. Only the time at which the at least one RF pulse is radiated is subsequently determined depending on this at least one parameter.

The boundary conditions can be that only the previously stated cases occur for the respective variant, such that in particular the fourth time interval $t_{R1}$ or the combination of fourth and fifth time interval $t_{R1}$, $t_{R2}$ corresponds to a valid solution.

The optimization criterion that is to be satisfied can thereby be composed of an arbitrary combination of the criteria listed in the following:

Minimize the time period $t_{shift}$.

Minimize eddy currents.

Dephase all coherence paths with the exception of a desired path.

Maximize a portion of the first time interval $t_F$ which lies between the RF pulses within the pause between the diffusion coding module and the diffusion decoding module.

Within the scope of the present invention, a magnetic resonance system is also provided for the acquisition of MR data with diffusion information in a predetermined volume segment of an examination subject. The magnetic resonance system has a basic field magnet, a gradient field system, at least one RF transmission antenna, at least one reception coil element, and a control device. The control device serves to control the gradient field system and the at least one RF transmission antenna. Moreover, the control device is designed in order to receive measurement signals which have been detected by the at least one reception coil element, and in order to evaluate these detected measurement signals and create corresponding MR data. The magnetic resonance system is designed in order to excite the volume segment with an excitation module, in order to radiate a diffusion coding module and a subsequent diffusion decoding module, in order to radiate at least one RF pulse after the excitation module, and in order to read out the MR data. Moreover, the magnetic resonance system is designed in order to operate with at least one of the following parameters:

a time period $t_{shift}$ which defines a time interval between a point in time at which the spin echo condition is satisfied and the echo time of the method, a first time interval $t_F$ by which a minimum possible time interval between the end of the diffusion coding module and the start of the diffusion decoding module is chronologically extended, a second time interval $t_{P1}$ by which a minimum possible time interval between the end of the excitation module and the start of the diffusion coding module is chronologically extended, a third time interval $t_{P2}$ by which a minimum possible time interval between the end of the diffusion decoding module and the start of the readout of the MR data is extended.

The magnetic resonance system acquires the MR data such that the at least one parameter ($t_{shift}$, $t_F$, $t_{P1}$, $t_{P2}$) is different than 0 s. The magnetic resonance system thereby determines at least a time at which the at least one RF pulse is radiated, depending on this at least one parameter.

It is noted that the set of parameters described in the preceding with which the magnetic resonance system according to the invention operates depends on the corresponding embodiment. Parameters which are not required by the corresponding embodiment or, respectively, which have a value of 0 s are not defined for the corresponding embodiment and therefore are also not determined by the magnetic resonance system. In other words, the present invention encompasses any embodiment in which one, two, three or four of the parameters described in the preceding are defined and then used to acquire the MR data with diffusion information or to determine the at least one time at which the at least one RF pulse is radiated.

The advantages of the magnetic resonance systems according to the invention essentially correspond to the advantages of the method according to the invention that have been described in detail above.

The present also encompasses a non-transitory, computer-readable data storage medium that is encoded with programming instructions that, when the storage medium is loaded into a computerized control and evaluation system of a magnetic resonance apparatus, cause the control and evaluation system to operate the magnetic resonance apparatus in accordance with one or more of the above-described embodiments of the method according to the invention.

The electronically readable data storage medium can be, for example, a DVD, a magnetic tape or a USB stick on which is stored electronically readable control information, in particular software. When this control information (software) is read from the data medium and stored in a controller or computer of a magnetic resonance system, all embodiments of the method according to the invention can be executed.

The present invention has the following advantages:

The introduction of the time interval $t_F$ offers a more flexible selection of the coding time δ and the diffusion time Δ. This applies to both the first variant (spin echo), the second variant (stimulated echo) and the third variant (double spin echo). For example, this enables an examination of the time dependencies on diffusion parameters over a wide range, for example to identify cellular microstructures.

In particular, given application of the time interval $t_F$ the third variant (double spin echo) enables a bipolar diffusion coding with less distortions due to eddy current fields and shortened echo time in that only three gradients (instead of four gradients) with changing polarity are still used given defined parameter combinations. The echo time can thereby be reduced by up to approximately 10 ms depending on the system type.

An additional shortening of the echo time TE can be achieved via the echo shift or, respectively, the introduction of the time period $t_{shift}$. The condition that the spin echo or stimulated echo must coincide with the scanning of the k-space center is weakened via the introduction of the time period $t_{shift}$, which leads to a shortening of the echo time for defined parameter combinations. This in particular applies to the first variant (spin echo) and the second variant (stimulated echo). In both variants, the echo time TE can be reduced by approximately 5 ms via the introduction of $t_{shift}$.

Because the eddy current fields at the point in time of the scanning of the k-space center do not need not to be completely suppressed (but rather only minimized), the degree of freedom of the allowed parameter combinations can in particular be advantageously increased in the third variant (double spin echo) in order to then optimize for other points of view.

The present invention is particularly suitable for the creation of MR images with diffusion information. Naturally, however, the present invention is not limited to this preferred field of application since the present invention can also be used to process the acquired diffusion information in another way, for example.

Figure 2:
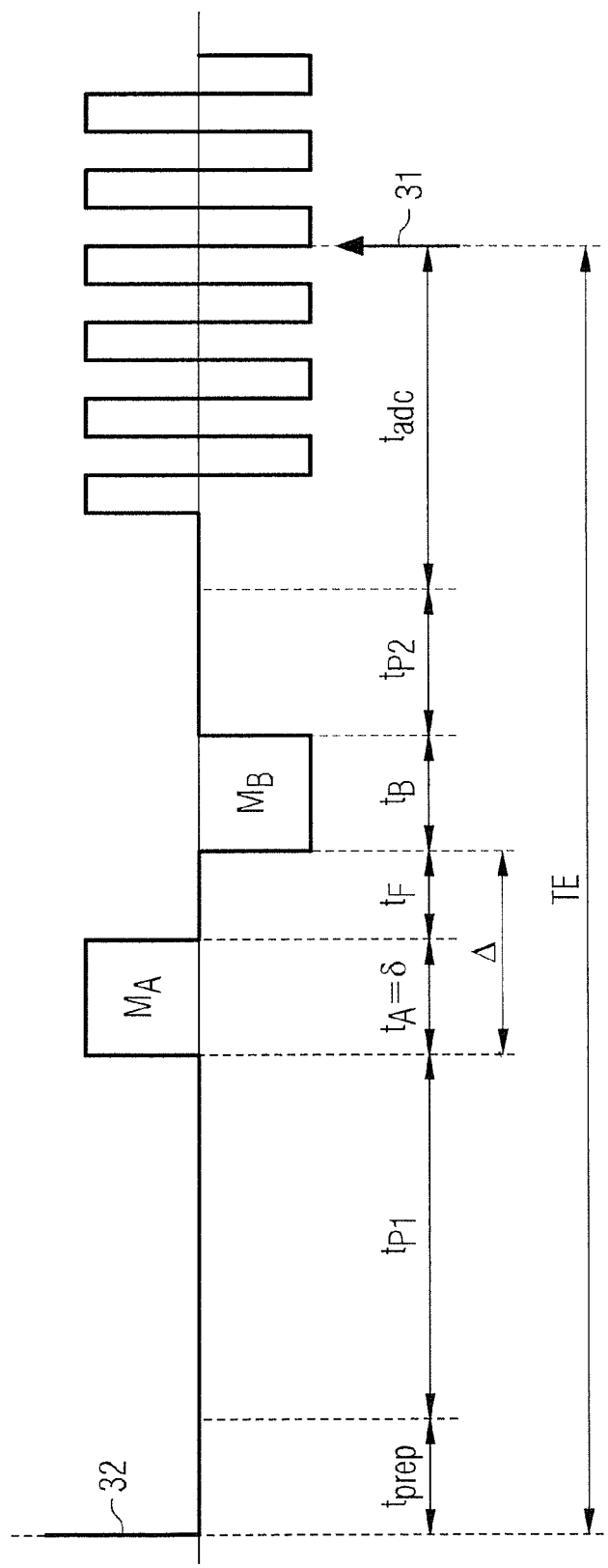

Shown in FIG. 2 are the most important parameters of a sequence (except $t_{shift}$).

Figure 3:
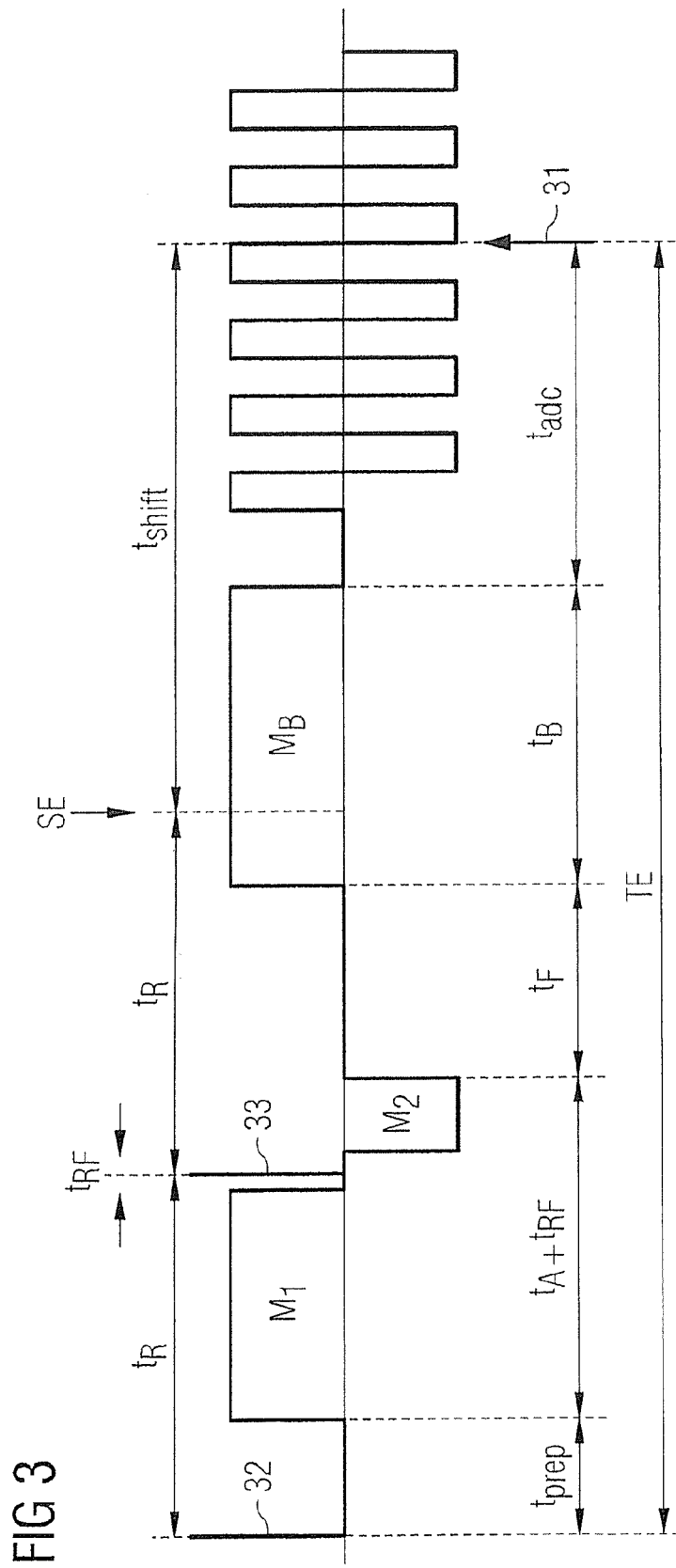

Shown in FIG. 3 are parameters of a spin echo sequence (first variant).

Figure 4:
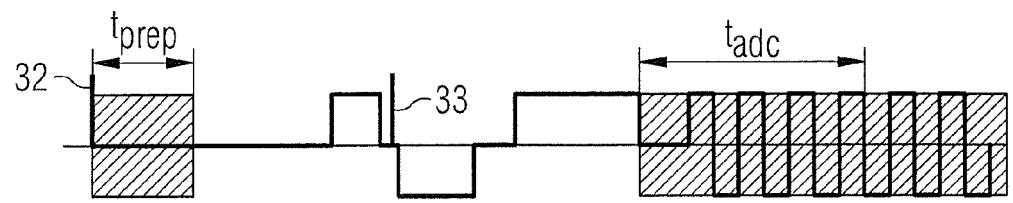
Figure 4:
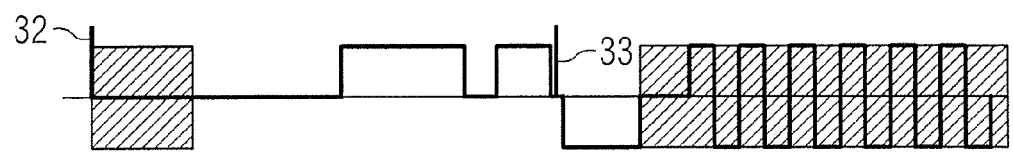
Figure 4:
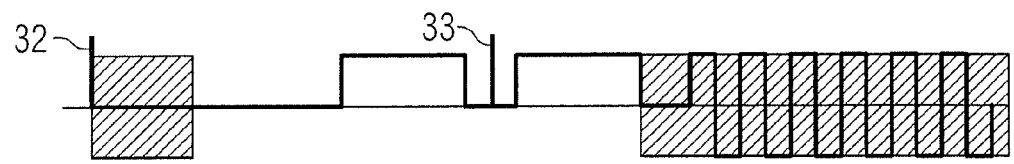
Figure 4:
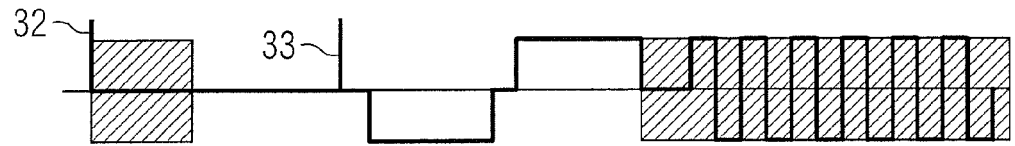

Shown in FIG. 4 are embodiments of the spin echo sequence.

Figure 5:
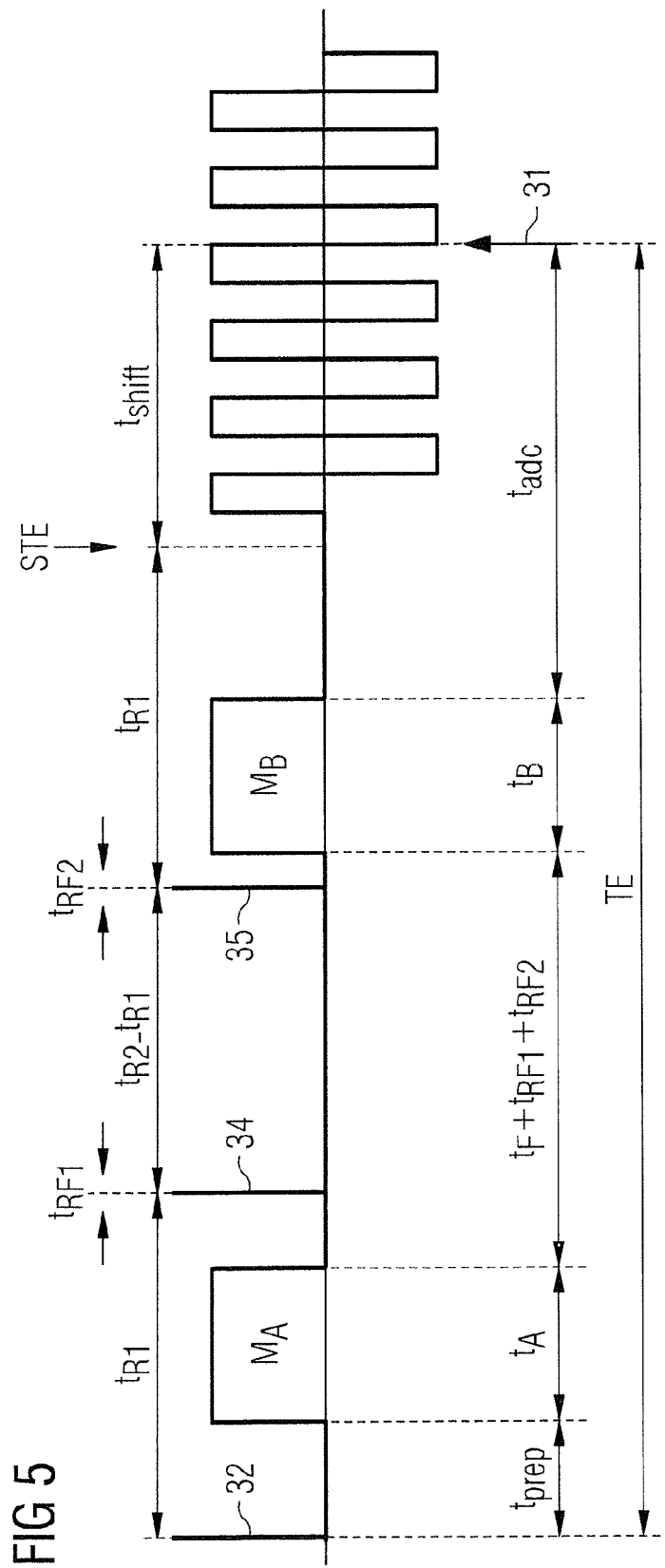

Shown in FIG. 5 are parameters of a sequence to generate a stimulated echo (second variant).

Figure 6:
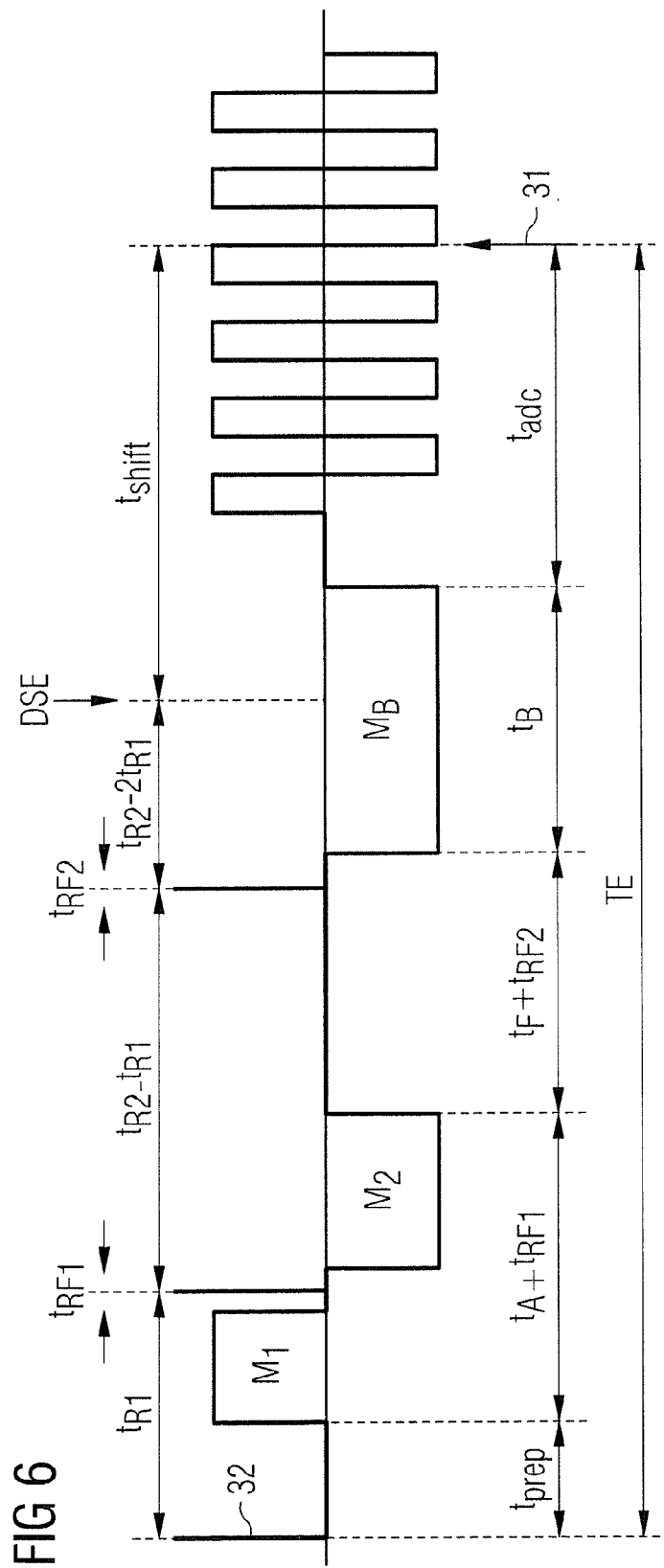

Shown in FIG. 6 are parameters of a double spin echo sequence (third variant).

Shown in FIG. 7 are embodiments of the double spin echo sequence.

DESCRIPTION OF THE PREFERRED EMBODIMENTS

Figure 1:
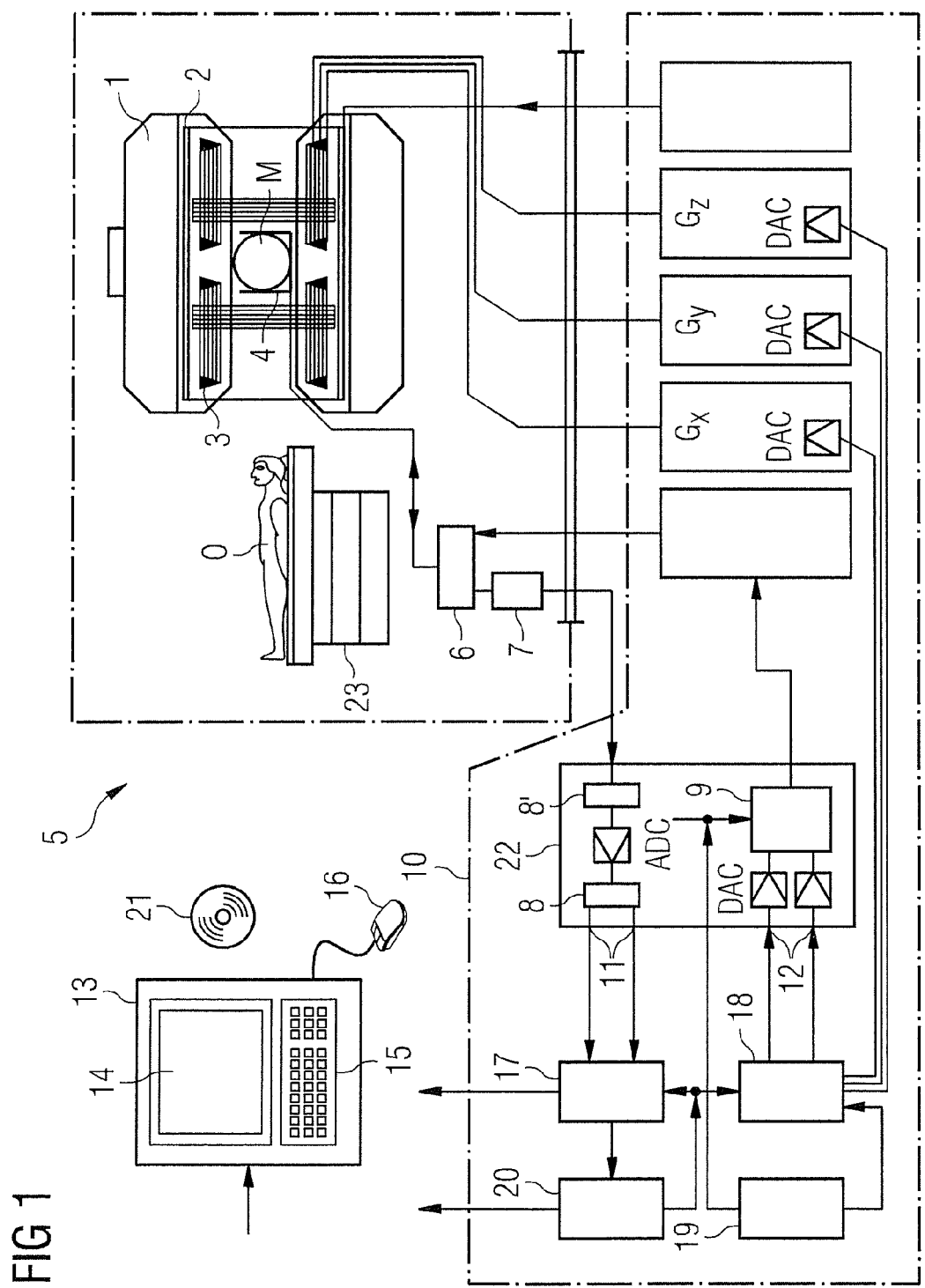
FIG. 1 shows a magnetic resonance system according to the invention.

FIG. 1 is a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in a volume segment of a subject O (for example a part of a human body that is to be examined) that lies on a table 23, and is examined in the magnetic resonance system 5. The high homogeneity of the basic magnetic field that is required for the nuclear magnetic resonance measurement is defined in a typically spherical measurement volume M in which are arranged the parts of the human body that are to be examined. To support the homogeneity requirements, and in particular to eliminate temporally invariable influences, shim plates made of ferromagnetic material are mounted at a suitable location. Temporally variable influences are eliminated by shim coils 2.

In the basic field magnet 1, a cylindrical gradient coil system 3 is used which comprises three sub-windings. Each sub-winding is supplied by an amplifier with current to generate a linear (also temporally variable) gradient field in the respective direction of the Cartesian coordinate system. The first sub-winding of the gradient field system 3 generates a gradient $G_x$ in the x-direction, the second sub-winding generates a gradient $G_y$ in the y-direction, and the third sub-winding generates a gradient $G_z$ in the z-direction. The amplifiers each include a digital/analog converter that is controlled by a sequence controller 18 for accurately-timed generation of gradient pulses.

Located within the gradient field system 3 is one or more radio-frequency antennas 4 which convert the radio-frequency pulses emitted by a radio-frequency power amplifier into an alternating magnetic field for excitation of the nuclei and alignment of the nuclear spins of the subject O to be examined or, respectively, of the region of the subject O that is to be examined. Each radio-frequency antenna 4 comprises one or more RF transmission coils and one or more RF reception coils in the form of an annular (advantageously linear or matrix-like) arrangement of component coils. The alternating field emanating from the precessing nuclear spins—i.e. normally the nuclear spin echo signals caused by a pulse sequence made up of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from said digital/analog converter to a transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M and scans resulting echo signals via the RF reception coil(s). The correspondingly acquired magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13 which comprises a keyboard 15, a mouse 16 and a monitor 14.

The most important parameters of a diffusion-weighted MR imaging sequence (with the exception of $t_{shift}$) are shown in FIG. 2. A diffusion-weighted MR imaging sequence essentially includes four parts: a spin preparation module or excitation module (for example excitation, navigators); a diffusion coding module with gradient moment $M_A$; a diffusion decoding module with gradient moment $M_B$; and a readout module. The preparation module (with the RF pulse 32) has the duration $t_{prep}$ and generates a spin coherence which is spatially coded during the readout module and is used for the imaging. The center of k-space—i.e. the point in time of the signal scan at which the magnetic moment impressed by the spatial coding gradients is zero—is scanned at the echo time TE. The diffusion coding module and the diffusion decoding module exist for diffusion weighting, wherein the beginning of the diffusion decoding module is delayed by a first time interval $t_F$. The beginning of the diffusion coding module is similarly delayed by a second time interval $t_{P1}$ and the beginning of the readout module is delayed by a third time interval $t_{P2}$.

Equation (1) normally applies:

$$M_A = M_B \tag{1}$$

If $M_i = G_D * t_i$ (i=A or i=B) applies for both gradient moments, wherein $G_D$ is the diffusion gradient amplitude, Equation (2) follows from this.

$$t_A = t_B \tag{2}$$

The following Equation (3) can be derived from FIG. 2:

$$t_S + t_{RF} + t_D + t_F + t_{P1} + t_{P2} = TE \tag{3}$$

wherein $t_D$ is the diffusion time ($t_A + t_B$) and $t_S$ is the sequence time ($t_{prep} + t_{adc}$). $T_{RF}$ is a duration which is required by additional refocusing RF pulses, which are not shown in FIG. 2. This duration $t_{RF}$ can also include the duration for spoiler gradients which are required in order to suppress unwanted coherences.

If TE, $t_S$, $t_{RF}$, $t_F$, $t_{P1}$ and $t_{P2}$ are provided, the durations $t_A$ and $t_{E3}$ can be determined via the following Equation (4).

$$t_A = t_B = t_D/2 = (TE - t_S - t_{RF} - t_{P1} - t_F - t_{P2})/2 \tag{4}$$

It is noted that, instead of a specification of $t_F$ and $t_{P1}$ or $t_F$ and $t_{P2}$, the variables $\delta = t_D/2$ and $\Delta$ can also be specified, from which $t_F$ and $t_{P1}$ or, respectively, $t_{P2}$ can then be determined according to the following Equations (5a, 5b).

$$t_F = \Delta - \delta \tag{5a}$$

$$t_{P1} = TE - t_S - t_{RF} - 2*\delta - t_F - t_{P2} \tag{5b}$$

RF pulses radiated within the diffusion time $\Delta$ must accordingly be taken into account in Equation (5a).

The previously presented results and equations apply to all variants according to the invention that are described in the following.

First Variant—Spin Echo

For the first variant (spin echo), only one refocusing module with a duration $t_{RF}$ is introduced, wherein the temporal middle of the refocusing module lies at a fourth time interval $t_R$ after the beginning of the excitation module or, respectively, after the RF excitation pulse 32. It is assumed that the refocusing module begins after the end of the excitation module. In the following description of this first variant, it is presently assumed that $t_{P1} = t_{P2} = 0$ applies, which is why neither $t_{P1}$ nor $t_{P2}$ are shown in FIG. 3.

The spin echo SE generated by the refocusing module occurs $2*t_R$ after the RF excitation pulse 32, wherein this time optimally coincides with the point in time 31 at which the k-space center is read out, from which the following Equation (7) is derived.

$$t_R = TE/2 \qquad (7)$$

However, according to the invention a time period $t_{shift}$ (with $t_{shift} < TE$) can be introduced so that the following Equation (8) applies.

$$t_R = (TE - t_{shift})/2 \qquad (8)$$

The following limits for the fourth time interval $t_R$ can be derived from FIG. 3 according to the inequalities (9a, 9b).

$$t_R \geq t_{prep} + t_{RF}/2 \qquad (9a)$$

$$t_R \leq TE - t_{adc} - t_{RF}/2 \qquad (9b)$$

Using Equations (4) and (8) with $t_{P1} = t_{P2} = 0$, it follows that:

$$t_F \geq t_{prep} - t_{adc} - t_D + t_{shift}$$

$$t_F \geq t_{adc} - t_{prep} - t_D - t_{shift}$$

As can be seen from FIG. 3, the introduction of the refocusing module can lead to the situation that the diffusion coding module (as shown in FIG. 3) or the diffusion decoding module is divided. The following cases of the first variant can be differentiated.

Splitting the Diffusion Coding Module

In order to subdivide the diffusion coding module into two gradients with the duration $t_1$ or, respectively, $t_2$, wherein $t_A = t_1 + t_2$ applies, the fourth time interval must satisfy the following inequality (10).

$$t_R < t_{prep} + t_A + t_{RF}/2 = t_{prep} F + (t_D + t_{RF})/2 \qquad (10)$$

Using Equations (4) and (8) with $t_{P1} = t_{P2} = 0$, this is the case if inequality (11) applies:

$$t_F < t_{prep} - t_{adc} + t_{shift} \qquad (11)$$

For a given $t_{prep}$ and $t_{adc}$, the validity range can be increased accordingly in that the time period $t_{shift}$ is increased accordingly. The corresponding durations $t_1$ through $t_3$ of the now three gradient pulses can be learned from Equations (12a-c).

$$t_1 = (t_D - t_{prep} + t_{adc} - t_{shift} + t_F)/2 \qquad (12a)$$

$$t_2 = (t_{prep} - t_{adc} + t_{shift} - t_F)/2 \qquad (12b)$$

$$t_3 = t_D/2 \qquad (12c)$$

In this case, the diffusion coding module comprises two gradients with amplitude $G_D$ and duration $t_1$ or, respectively, $t_2$, wherein these two gradients have different polarity. The diffusion decoding module comprises a single gradient of a duration $t_3$ with the same amplitude $G_D$ (in terms of magnitude) and a polarity which corresponds to the polarity of the first gradient of the diffusion coding module.

Splitting the Diffusion Decoding Module

The splitting of the diffusion decoding module into two gradients with duration $t_2$ or, respectively, $t_3$ (wherein $t_B = t_2 + t_3$ applies) occurs when the following inequality (13) is satisfied.

$$t_R > t_{prep} + t_A + t_F + t_{RF}/2 = t_{prep} + t_F + (t_D + t_{RF})/2 \qquad (13)$$

Using Equations (4) and (8) with $t_{P1} = t_{P2} = 0$, this is the case if the inequality (14) applies:

$$t_F < t_{adc} - t_{prep} - t_{shift} \qquad (14)$$

In this instance, the validity range can be expanded in that the time period $t_{shift}$ is reduced. The corresponding durations $t_1$ through $t_3$ of the three gradient pulses can be learned from Equations (15a-c).

$$t_1 = t_D/2 \qquad (15a)$$

$$t_2 = (t_{adc} - t_{prep} + t_{shift} + t_F)/2 \qquad (15b)$$

$$t_3 = (t_D - t_{adc} + t_{prep} + t_{shift} + t_F)/2 \qquad (15c)$$

In this case, the diffusion decoding module comprises two gradients with amplitude $G_D$ and the duration $t_2$ or, respectively, $t_3$, wherein these two gradients have different polarity. The diffusion coding module comprises a single gradient of the duration $t_1$ which has the same amplitude and polarity as the third gradient (the second gradient of the diffusion decoding module).

No Splitting

No splitting (of the diffusion coding module or of the diffusion decoding module) is required if the refocusing pulse lies between the diffusion coding module and the diffusion decoding module, which is the case if the following inequalities (16a, b) are both satisfied.

$$t_R \geq t_{prep} + (t_D + t_{RF})/2 \qquad (16a)$$

$$t_R \leq t_{prep} + t_F + (t_D + t_{RF})/2 \qquad (16b)$$

Using Equations (4) and (8) with $t_{P1} = t_{P2} = 0$, this is the case if the inequalities (17a,b) both apply:

$$t_F \geq t_{prep} - t_{adc} + t_{shift} \qquad (17a)$$

$$t_F \geq t_{adc} - t_{prep} + t_{shift} \qquad (17b)$$

Depending on $t_{prep}$ and $t_{adc}$, the validity range can in this case be extended in that the time period t is extended or shortened.

Moreover, by introducing the second time interval $t_{P1}$ it is possible to radiate the refocusing pulse even before the diffusion coding module if the following inequality applies:

$$t_{prep} + t_{RF}/2 \leq t_R \leq t_{prep} + t_{P1} + t_{RF}/2$$

In the same way, the third time interval $t_{P2}$ can be introduced in order to radiate the refocusing pulse 33 after the diffusion decoding module if the inequality (UG5) applies.

$$t_{prep} + t_{P1} + t_{RF}/2 + t_D + t_F \leq t_R \leq TE - t_{adc} - t_{RF}/2 \qquad (UG5)$$

Both the diffusion coding module and the diffusion decoding module respectively comprise a single gradient pulse with the amplitude $G_D$, wherein the two gradient pulses have the same duration ($t_1 = t_2 = t_D/2$). The two gradient pulses have an identical polarity if the RF pulse lies between the diffusion coding module and the diffusion decoding module; otherwise, the two gradient pulses have an opposite polarity.

The possible cases of the first variant (spin echo) (except for the last described) are shown in FIG. 4. FIG. 4a thereby shows the split of the diffusion coding module; FIG. 4b shows the splitting of the diffusion decoding module, and the two FIGS. 4c and 4d show the two possibilities in which neither the diffusion coding module nor the diffusion decoding module are split.

For the case of $t_{P1} = t_{P2} = 0$, the following three possibilities thus exist for the selection of the fourth time interval $t_R$:

1. $t_{prep} + t_{RF}/2 \leq t_R < t_{prep} + t_{RF}/2 + t_D/2$
2. $t_{prep} + t_{RF}/2 + t_D/2 \leq t_R \leq t_{prep} + t_{RF}/2 + t_D/2 + t_F$
3. $t_{prep} + t_{RF}/2 + t_D/2 + t_F \leq t_R \leq t_{prep} + t_{RF}/2 + t_D/2 + t_F + t_D/2$ or, respectively, $t_{prep} + t_{RF}/2 + t_D/2 + t_F \leq t_R \leq TE - t_{adc} - t_{RF}/2$ The fourth time interval $t_R = TE/2$ is conventionally selected so that the spin echo refocuses precisely at the echo time TE.

However, according to the invention it is possible via a corresponding selection of $t_{shift}$ that $t_R \neq TE/2$ applies, such that it is possible to expand the range of valid solutions in which $t_R$ satisfies one of the three inequalities listed above.

For example, if $t_{prep}=TE/2$ is selected, no valid solution can be found according to the prior art (without $t_{shift}$ or, respectively, $t_{shift}=0$) since it follows from $t_R=TE/2$ that: $t_R < t_{prep} + t_{RF}/2$. However, via the use of $t_{shift}$ the point in time of the refocusing of the spin echoes can be shifted so that at least the previously described 1st possibility can be realized via the selection $t_{shift} < -t_{RF}/2$.

According to the prior art, the selection $t_{adc}$ TE/2 also does not lead to a valid solution since it follows from $t_R=TE/2$ that: $t_R > TE - t_{adc} - t_{RF}/2$. However, the point in time of the refocusing of the spin echoes can again be shifted via the use of $t_{shift}$ so that at least the 3rd possibility described in the preceding can be realized via the selection of $t_{shift} > t_{RF}/2$.

In the following, an algorithm according to the invention is described for the selection of the fourth time interval $t_R$ for the first variant:
1. Input $t_{prep}$, $t_{RF}$, $t_{adc}$, TE and $t_F$ (or alternatively: $t_{prep}$, $t_{RF}$, $t_{adc}$, $\delta$, $\Delta$).
2. If $t_R=TE/2$ leads to a valid solution (i.e. if one of the three inequalities described in the preceding applies to $t_R$), $t_R=TE/2$ is then defined.
3. Select a minimum (in terms of absolute value) $t_{shift}$ for which $t_R=TE/2 - t_{shift}$ is a valid solution. In the event that it is possible, $t_R$ for this $t_{shift}$ is determined according to $T_R=TE/2-t_{shift}$.

The introduction of the third time interval $t_{P2}$, whereby the time interval between the end of the diffusion decoding module and the start of the MR data acquisition is extended, in particular enables that the instance in which the refocusing pulse lies between the diffusion coding module and the diffusion decoding module is possible for a larger parameter range. It is thereby noted that the third time interval $t_{P2}$ can be derived automatically, for example from the parameters TE, $\delta$, $\Delta$. While the parameters $t_{prep}$, $t_{adc}$, TE and $t_{RF}$ are always to be predetermined, selection can be made among $t_{P1}$, $t_{P2}$ and $t_F$, or
$t_{P1}$, $\delta$ and $\Delta$, or
$t_{P2}$, $\delta$ and $\Delta$ as a further specification.

Second Variant—Stimulated Echo

In the second variant, two RF pulses (in particular 90° pulses) are radiated (instead of the one refocusing pulse of the first variant), wherein the chronologically first RF pulse is generated by a storing module and the following second RF pulse is generated by a restoring module. The temporal middle of the storing module lies at a fourth time interval $t_{R1}$ after the beginning of the excitation module or, respectively, after the RF excitation pulse 32, while the temporal middle of the restoring module lies at a fifth time interval $t_{R2}$ after the beginning of the excitation module. It is thereby assumed that the storing module begins after the end of the excitation module and the restoring module begins after the end of the restoring module. In the following description of this second variant, it is assumed that $t_{P1}=t_{P2}=0$, which is why neither $t_{P1}$ nor $t_{P2}$ are shown in FIG. 5.

The beginning of the storing module (which has a duration of $t_{RF1}$) must lie after the end of the diffusion coding module, an the end of the restoring module (which has a duration of $t_{RF2}$) must thereby lie before the beginning of the diffusion coding module. The stimulated echo STE is generated at a duration $t_{STE}=t_{R2}+t_{R1}$ after the beginning of the excitation module or, respectively, after the RF excitation pulse 32. It is conventionally sought that this point in time coincides with the point in time 31 at which the center of k-space is detected, which then leads to the following Equation (18).

$$t_{R1}+t_{R2}=TE \quad (18)$$

It is noted that, in agreement with FIG. 2, in the second variant of the duration the echo time TE also corresponds to the duration between the RF excitation pulse 32 and the point in time 31 at which the k-space center is scanned. This means that the echo time TE includes what is known as a mixed time $t_{mix}=t_{R2}+t_{R1}$ during which the magnetization along the longitudinal axis is stored. However, the $T_2$ relaxation occurs only before the storing module and after the restoring module (more specifically before the middle of the storing module and after the middle of the restoring module), such that the $T_2$ relaxation does not occur during the echo time at the time period $t_{R2}-t_{R1}$.

In the second variant, it is also helpful to introduce the time period $t_{shift}$, which leads to the following Equation (19), wherein $t_{shift} < TE$ applies.

$$t_{R1}+t_{R2}=TE-t_{shift} \quad (19)$$

With the aid of FIG. 5, the following boundary conditions can then be derived for $t_{R1}$ and $t_{R2}$ according to the inequalities (20a-c).

$$t_{R1} \geq t_{prep}+t_D/2+t_{RF1}/2 \quad (20a)$$

$$t_{R2} \leq TE-t_{adc}-t_D/2-t_{RF2}/2 \quad (20b)$$

$$t_{R2}-t_{RF2}/2 \geq t_{R1}+t_{RF1}/2 \quad (20c)$$

It should be taken into account that the diffusion coding module lies before the storing module or, respectively, the diffusion decoding module lies after the restoring module (while the magnetization is located in the transverse plane).

Using Equations (4) and (19) with $t_{P1}=t_{P2}=0$, the following inequalities (21a-c) can be derived from these.

$$t_{R1} \geq t_{prep}+t_D/2+t_{RF1}/2 \quad (21a)$$

$$t_{R1} \geq t_{adc}+t_D/2+t_{RF2}/2-t_{shift} \quad (21b)$$

$$t_{R1} \leq t_S/2+t_D/2+t_F/2+t_{RF1}/4+t_{RF2}/4-t_{shift}/2 \quad (21c)$$

Depending on the selection of $t_D$, $t_F$, $t_{RF1}$, $t_{RF2}$, $t_{prep}$ and $t_{adc}$, the validity range (i.e. the range for which the inequalities (21a-c) are satisfied) can be expanded in that the time period $t_{shift}$ is extended or shortened.

In the second variant, the diffusion coding module and the diffusion decoding module each include a single gradient pulse with the amplitude $G_D$, wherein the two gradient pulses have the same duration ($t_1=t_2=t_D/2$) and the same polarity.

In the following, according to the invention procedures are described in order to determine the fourth time interval $t_{P1}$ and the fifth time interval $t_{R2}$.

In order to minimize the scope of the $T_2$ relaxation, the solution with the smallest value for $t_{P1}$ is preferred. Depending on the determined values for $t_{prep}$, $t_{adc}$, $t_{RF1}$ and $t_{RF2}$, Equation (22a) or Equation (22b) results from this.

$$t_{R1}=t_{prep}+t_D/2+t_{RF1}/2 \quad (22a)$$

$$t_{P1}=t_{adc}+t_D/2+t_{RF2}/2-t_{shift} \quad (22b)$$

Under consideration of the inequality (21c), valid solutions exist when the inequality (23a) or inequality (23b) applies.

$$t_F \geq t_{prep}-t_{adc}+t_{RF1}/2-t_{RF2}/2+t_{shift} \quad (23a)$$

$$t_F \geq t_{adc}-t_{prep}-t_{RF1}/2+t_{RF2}/2-t_{shift} \quad (23b)$$

$t_{shift}=0$ is selected (from which $t_{R2}=TE-t_{R1}$ results) so that the stimulated echo refocuses just after TE. However, via a corresponding selection of the time period $t_{shift} \neq 0$ it is possible to expand the solution range for some parameter combinations. It is noted that, according to inequalities (23a, b), the minimum value of $t_{R1}$ can be achieved for different values of the first time interval $t_F$. This is correct since $t_F$ includes the mixing time between the storing module and the restoring module which does not contribute to $t_R$ (and not to the $T_2$ relaxation).

For example, if $t_{prep}+t_{RF1}/2 > t_{adc}+t_{RF2}/2$ applies (which means that (22a) and (23a) are valid) and $t_F=t_{prep}-t_{adc}$ is chosen, no valid solution results for $t_{shift}=0$. Only with $t_{shift} < t_{RF1}/2 - t_{RF2}/2$ can a valid solution be achieved.

In the following, a method according to the invention is described for the determination of the fourth time interval $t_{R1}$ and the fifth time interval $t_{R2}$ for the second variant.

1. Enter $t_{prep}$, $t_{RF1}$, $t_{RF2}$, $t_{adc}$, TE, $t_F$ ($t_{prep}$, $t_{RF1}$, $t_{RF2}$, $t_{adc}$, δ, Δ can alternatively be predetermined).
2. If $t_{prep}+t_{RF1}/2 < t_{adc}+t_{RF2}/2$ applies, go to point 9.
3. Determine the smallest possible value for $t_{P1} \geq 0$ for which $t_{prep}+t_{P1}\,t_{RF1}/2 \geq t_{adc}+t_{P2}+t_{RF2}/2$ applies.
4. If a minimum (in terms of absolute value) $t_{shift}$ is a valid solution for $t_{R1}=t_{prep}+t_{P1}+t_D/2+t_{RF1}/2$ and $t_{R2}=TE-t_{shift}-t_{R1}$, use this solution and end the method.
5. Determine $t_{P1}$ and $t_{P2}$ so that $|(t_{prep}+t_{P1}+t_{RF1})-(t_{adc}+t_{P2}+t_{RF2}/2))|$ is minimal.
6. If $t_{prep}+t_{P1}+t_{RF1} < t_{adc}+t_{P2}+t_{RF2}/2$, go to point 8.
7. If $t_{R1}=t_{adc}+t_{P2}+t_D/2+t_{RF2}/2$ und $t_{R2}=TE-t_{R1}$ is a valid solution, use this solution; otherwise, the method ends unsuccessfully.
8. If $t_{R1}=t_{prep}+t_{P1}+t_D/2+t_{RF1}/2$ und $t_{R2}=TE-t_{R1}$ is a valid solution, use this solution; otherwise, the method ends unsuccessfully.
9. Determine the smallest possible value for $t_{P2} \geq 0$ for which $t_{prep}+t_{P1}\,t_{RF1}/2 \leq t_{adc}+t_{P2}+t_{RF2}/2$ applies, and go to point 4.

A solution is deemed to be valid if the following inequalities (UG7-UG9) are satisfied.

$$t_{R1} \geq t_{prep}+t_{P1}+t_D/2+t_{RF1}/2 \tag{UG7}$$

$$t_{R2} \leq TE-t_{adc}-t_{P2}-t_D/2-t_{RF2}/2 \tag{UG8}$$

$$t_{R2}-t_{RF2}/2 \geq t_{R1}+t_{RF1}/2 \tag{UG9}$$

If it is not desirable to operate with $t_{shift} \neq 0$, or if it is not desired to maximize the portion of $t_F$ between the RF pulses, the method degenerates [sic] according to the following:

1. Input $t_{prep}$, $t_{RF1}$, $t_{RF2}$, $t_{adc}$, TE, $t_F$ ($t_{prep}$, $t_{RF1}$, $t_{RF2}$, $t_{adc}$, δ, Δ can alternatively be predetermined).
2. Determine $t_{P1}$ and $t_{P2}$ so that $|(t_{prep}+t_{P1}+t_{RF1})-(t_{adc}+t_{P2}+t_{RF2}/2)|$ is minimal.
3. If $t_{prep}+t_{P1}+t_{RF1} < t_{adc}+t_{P2}+t_{RF2}/2$, go to point 5.
4. If $t_{R1}=t_{adc}+t_{P2}+t_D/2+t_{RF2}/2$ and $t_{R2}=TE-t_{R1}$ is a valid solution, use this solution; otherwise the method ends unsuccessfully.
5. If $t_{R1}=t_{prep}+t_{P1}+t_D/2+t_{RF1}/2$ und $t_{R2}=TE-t_{R1}$ is a valid solution, use this solution; otherwise the method ends unsuccessfully.

It is noted that the sum ($t_{P1}+t_{P2}$) can also be predetermined at point 1 in both of the methods described in the preceding.

The introduction of the third time interval $t_{P2}$, whereby the time interval between the end of the diffusion decoding module and the start of the MR data acquisition is extended, increases the degree of freedom in the determination of the parameters of the imaging sequence. It is thereby noted that the third time interval $t_{P2}$ can be derived automatically, for example from the parameters TE, δ, Δ.

Third Variant—Double Spin Echo

In the third variant (double spin echo), instead of the one refocusing pulse of the first variant (spin echo) or instead of the storing module and the restoring module of the second variant (stimulated echo), two refocusing modules with the duration $t_{RF1}$ or, respectively, $t_{RF2}$ are introduced, wherein the temporal middle of the first refocusing pulse lies at a fourth time interval $t_{R1}$ after the beginning of the excitation module or, respectively, after the RF excitation pulse 32, and the temporal middle of the second refocusing pulse lies at a fifth time interval $t_{R2}$ after the beginning of the excitation module or, respectively, after the RF excitation pulse 32. It is assumed that the first refocusing module begins after the end of the excitation module and the second refocusing module begins after the end of the first refocusing module. In the following description of this third variant, it is presently assumed that $t_{P1}=t_{P2}=0$ applies, which is why neither $t_{P1}$ nor $t_{P2}$ are depicted in FIG. 6.

The doubly refocused spin echo DSE is generated at a time period $t_{DSE}=2*(t_{R2}-t_{R1})$ after the RF excitation pulse 32. This point in time advantageously coincides with the point in time 31 at which the center of k-space is detected, which leads to the following Equation (24).

$$t_{R2}-t_{R1}=TE/2 \tag{24}$$

According to the invention, it is possible to introduce the time period $t_{shift}$ which then leads to Equation (25), wherein $t_{shift} < TE$ applies.

$$t_{R2}+t_{R1}=(TE-t_{shift})/2 \tag{25}$$

The boundary conditions for the fourth time interval $t_{R1}$ and the fifth time interval $t_{R2}$ can be derived from FIG. 6, corresponding to the inequalities ($26a_1$-$c_1$).

$$t_{R1} \geq t_{prep}+t_{RF1}/2 \tag{$26a_1$}$$

$$t_{R2} \leq TE-t_{adc}-t_{RF2}/2 \tag{$26b_1$}$$

$$t_{R2}-t_{RF2}/2 \geq t_{R1}+t_{RF1}/2 \tag{$26c_1$}$$

With the use of Equations (4) and (25) with $t_{P1}=t_{P2}=0$, the following inequalities ($26a_2$-$c_2$) can be derived therefrom.

$$t_{R1} \geq t_{prep}+t_{RF1}/2 \tag{$26a_2$}$$

$$t_{R1} \leq (t_{prep}-t_{adc}+t_D+t_F+t_{RF1}+t_{shift})/2 \tag{$26b_2$}$$

$$t_{shift} \leq t_F+t_D+t_{adc}+t_{prep}=TE-t_{RF1}-t_{RF2} \tag{$26c_2$}$$

As can be seen from FIG. 6, the introduction of the refocusing modules can lead to the situation that the diffusion coding module (as shown in FIG. 6) or the diffusion decoding module is divided. The following cases of the third variant can be differentiated.

Splitting the Diffusion Coding Module (Only) the diffusion coding module is split into two gradients with duration $t_1$ or, respectively, $t_2$ ($t_A=t_1+t_2$) if both of the following inequalities (27a, b) apply. This means that the diffusion decoding module is not divided into multiple gradients.

$$t_{R1} < t_{prep}+t_A+t_{RF1}/2 \tag{27a}$$

$$t_{R2} \leq t_{prep}+tA+t_{RF1}+t_F+t_{RF2}/2 \tag{27b}$$

The inequalities (28a,b) follow from the inequalities (27a, b).

$$t_{R1} < t_{prep}+(t_D+t_{RF1})/2 \tag{28a}$$

$$t_{R1} \leq (t_{prep}-t_{adc}+t_{RF1}+t_F+t_{shift})/2 \tag{28b}$$

Depending on the parameters $t_{prep}$, $t_{adc}$, $t_{RF1}$ and $t_D$, the valid value range for the fourth time interval $t_{R1}$ (and therefore for the fifth time interval $t_{R2}$) can be expanded in that $t_{shift}$ is extended.

The corresponding durations $t_1$ through $t_3$ of the three gradient pulses obey Equations (29a-c).

$$t_1 = t_{R1} - t_{RF1}/2 - t_{prep} \tag{29a}$$

$$t_2 = t_D/2 - t_{R1} + t_{RF1}/2 + t_{prep} \tag{29b}$$

$$t_3 = t_D/2 \tag{29c}$$

Moreover, the fourth time interval $t_{R1}$ can be determined such that eddy current fields are minimized or such that unwanted spin coherences are implicitly suppressed.

In this case, the diffusion coding module comprises two gradients with the absolute amplitude $G_D$, the duration $t_1$ or $t_2$ and opposite polarity. The diffusion decoding module comprises only a single gradient which has this amplitude $G_D$ and the same polarity as the second gradient of the diffusion coding module. The duration of the gradient of the diffusion decoding module is $t_3$.

Splitting the Diffusion Decoding Module (Only) the diffusion decoding module is divided into two gradients with duration $t_2$ or, respectively, $t_3$ ($t_B = t_2 + t_3$) if the following inequalities (30a, b) both apply. This means that the diffusion coding module is not split into multiple gradients.

$$t_{R1} \geq t_{prep} + t_A + t_{RF1}/2 \tag{30a}$$

$$t_{R2} > t_{prep} + t_A + t_{RF1} + t_F + t_{RF2}/2 \tag{30b}$$

In particular, it is thereby implicitly assumed that the second refocusing module ends before the readout module begins.

Inequalities (31a, b) follow from the inequalities (30a, b).

$$t_{R1} \geq t_{prep} + (t_D + t_{RF1})/2 \tag{31a}$$

$$t_{R1} > (t_{prep} - t_{adc} + t_{RF1} + t_F + t_{shift})/2 \tag{31b}$$

Depending on parameters $t_{prep}$, $t_{adc}$, $t_{RF1}$ and $t_D$, the valid value range for the fourth time interval $t_{R1}$ (and therefore for the fifth time interval $t_{R2}$) can be expanded in that $t_{shift}$ is shortened.

The corresponding durations $t_1$ through $t_3$ of the three gradient pulses obey Equations (32a-c).

$$t_1 = t_D/2 \tag{32a}$$

$$t_2 = (t_{adc} - t_{prep} - t_F - t_{RF1} - t_{shift})/2 + t_{R1} \tag{32b}$$

$$t_3 = (t_{prep} - t_{adc} + t_D + t_F + t_{RF1} + t_{shift})/2 - t_{R1} \tag{32c}$$

In this case, the diffusion decoding module comprises two gradients with absolute amplitude $G_D$, duration $t_2$ or, respectively, $t_3$ and opposite polarity. The diffusion coding module comprises only a single gradient which has the same amplitude $G_D$ and the same polarity as the second gradient of the diffusion decoding module. The duration of the gradient of the diffusion coding module is $t_i$.

Splitting Both the Diffusion Coding Module and the Diffusion Decoding Module

Both the diffusion coding module and the diffusion coding module [sic] are respectively split into two gradients if the following inequalities (33a, b) both apply. The first or second gradient of the diffusion coding module has the duration $t_1$ or $t_2$ ($t_A t_1 + t_2$), while the first or, respectively, second gradient of the diffusion coding module has the duration $t_3$ or, respectively, $t_4$ ($t_B = t_3 + t_4$).

$$t_{R1} < t_{prep} + t_A + t_{RF1}/2 \tag{33a}$$

$$t_{R2} > t_{prep} + t_A + t_{RF1} + t_F + t_{RF2}/2 \tag{33b}$$

It is assumed that the second refocusing module ends before the readout module begins.

The inequalities (34a,b) follow from inequalities (33a,b).

$$t_{R1} < t_{prep} + (t_D + t_{RF1})/2 \tag{34a}$$

$$t_{R1} > (t_{prep} - t_{adc} + t_{RF1} + t_F + t_{shift})/2 \tag{34b}$$

Depending on the parameters $t_{prep}$, $t_{adc}$, $t_{RF1}$ and $t_D$, the valid value range for the fourth time interval $t_{R1}$ (and therefore for the fifth time interval $t_{R2}$) can be expanded in that $t_{shift}$ is shortened.

The corresponding durations $t_1$ through $t_4$ of the four gradient pulses obey Equations (35a-d).

$$t_1 = t_{R1} - t_{RF1}/2 - t_{prep} \tag{35a}$$

$$t_2 = t_D/2 - t_{R1} + t_{RF1}/2 + t_{prep} \tag{35b}$$

$$t_3 = (t_{adc} - t_{prep} - t_F - t_{RF1} - t_{shift})/2 + t_{R1} \tag{35c}$$

$$t_4 = (t_{prep} - t_{adc} + t_D + t_F + t_{RF1} + t_{shift})/2 - t_{R1} \tag{35d}$$

In this case, the diffusion coding module comprises two gradients with absolute amplitude $G_D$, duration $t_1$ or, respectively, $t_2$ and opposite polarity. The diffusion decoding module in this case also comprises two gradients with the absolute amplitude $G_D$, the duration $t_3$ or, respectively, $t_4$, and likewise opposite polarity. The polarity of the first gradients of the diffusion coding module corresponds to the polarity of the first gradient of the diffusion decoding module.

No Split

Neither the first nor second refocusing pulse splits the diffusion coding module or the diffusion decoding module if the following inequalities (36a, b) both apply.

$$t_{R1} \geq t_{prep} + t_A + t_{RF1}/2 \tag{36a}$$

$$t_{R2} \leq t_{prep} + t_A + t_{RF1} + t_F + t_{RF2}/2 \tag{36b}$$

The inequalities (37a,b) follow from inequalities (36a,b).

$$t_{R1} \geq t_{prep} + (t_D + t_{RF1})/2 \tag{37a}$$

$$t_{R1} \leq (t_{prep} - t_{adc} + t_{RF1} + t_F + t_{shift})/2 \tag{37b}$$

Depending on the parameters $t_{prep}$, $t_{adc}$, $t_{RF1}$ and $t_D$, the valid value range for the fourth time interval $t_{R1}$ (and therefore for the fifth time interval $t_{R2}$) can be expanded in that $t_{shift}$ is shortened.

The corresponding durations of the gradient of the diffusion coding module $t_1$ and of the gradient of the diffusion decoding module $t_2$ obey the simple equations (38a, b).

$$t_1 = t_D/2 \tag{38a}$$

$$t_2 = t_D/2 \tag{38b}$$

In this case, the diffusion coding module comprises a single gradient with the absolute amplitude $G_D$ and the duration $t_1$. The diffusion decoding module also comprises only a single gradient with the same absolute amplitude $G_D$ and duration $t_2$ but has the opposite polarity.

In the following, a method according to the invention is described for the determination of the fourth time interval $t_{R1}$ and the fifth time interval $t_{R2}$.

1. Enter $t_{prep}$, $t_{RF1}$, $t_{RF2}$, $t_{adc}$, TE, $t_F$ (alternatively, $t_{prep}$, $t_{RF1}$, $t_{RF2}$, $t_{adc}$, $\delta$, $\Delta$ can be predetermined).
2. If $t_{R2} - t_{R1} = TE/2$ does not lead to a valid solution, go to point 5.
3. Set $t_{shift}$ 4. Go to point 6.
5. Determine a minimum (in terms of absolute value) $t_{shift}$ so that the condition $t_{R2}-t_{R1}=(TE-t_{shift})/2$ leads to a valid solution.
6. Identify the case in which $t_{R1}$ lies in a valid range.
7. Under these circumstances, determine the value of $t_{R1}$ such that a secondary condition is optimally satisfied.

Depending on $t_{prep}$, $t_{adc}$, $t_{RF1}$ and $t_D$, the following valid ranges thereby exist for $t_{R1}$ which lead to a valid solution:

1. $t_{R1} < t_{prep} + (t_D + t_{RF1})/2$
and $t_{R1} \leq (t_{prep} - t_{adc} + t_{RF1} + t_F + t_{shift})/2$
2. $t_{R1} \geq t_{prep} + (t_D + t_{RF1})/2$
and $t_{R1} > (t_{prep} - t_{adc} + t_{RF1} + t_F + t_{shift})/2$
3. $(t_{prep} - t_{adc} + t_{RF1} + t_F + t_{shift})/2 < t_{R1} < t_{prep} + (t_D + t_{RF1})/2$
4. $(t_{prep} - t_{adc} + t_{RF1} + t_F + t_{shift})/2 \geq t_{R1} \geq t_{prep} (t_D + t_{RF1})/2$ The fourth time interval $t_{R1}$ (and therefore the fifth time interval $t_{R2}$) can be selected as a possible condition such that the scope of the eddy current fields is minimized.

If the second time interval $t_{P1} > 0$, it is likewise possible that the first refocusing module (and even the first and second refocusing module) lies within this second time interval $t_{P1}$. The circumstances of the third variant according to the invention (double spin echo) that are then possible are shown in FIGS. 7a through 7h. FIGS. 7e through 7h thereby present those cases which have been described in detail in advance.

The present invention (i.e. all three variants) requires a linear correlation between the moment $M_A$ and $M_B$, and the duration $t_A$ and $t_B$ of the diffusion modules. However, this correlation is only valid if all gradient pulses have the identical ramp duration and if the diffusion coding module and diffusion decoding module have the identical number of gradient ramps. The duration during which the amplitude of the gradient rises or, respectively, falls is thereby designated as a ramp duration.

Equations (39a,b) indicate a correlation between the duration t of a gradient pulse and the associated moment M.

$$M = G_D * (t - T_{ramp}), \text{ if } t \geq 2 * T_{ramp} \quad (39a)$$

$$M = G_D * t^2 / (4 * T_{ramp}), \text{ if } t < 2 * T_{ramp} \quad (39b)$$

A trapezoidal gradient comprises a rise phase up to the (maximum) amplitude $G_D$, with a duration $T_{ramp}$; a phase in which the gradient includes the amplitude $G_D$ and which has the duration $t - 2*T_{ramp}$; and a decline phase to the value of 0, again with a duration $t_{ramp}$. In contrast to this, a triangular gradient includes only a rise phase in which it rises up to the value $G_D * t/(2 * T_{ramp})$, and which has a duration t/2, and a decline phase in which it drops to a value of 0 and which likewise has a duration t/2.

In order to take into account the nonlinear relationship between the moment $M_A$ or, respectively, $M_B$ and the duration $t_A$ or, respectively, $t_B$ of the diffusion coding module or, respectively, diffusion decoding module in the method according to the invention to acquire the MR data, the following procedure according to the invention is proposed:

T$_{ramp}$=0 is assumed for the determination of the chronological workflow of the gradient according to the invention (i.e. given the determination of the parameters according to the invention).

The moments of all gradients are subsequently determined according to Equations (39), wherein now the actual ramp duration $T_{ramp} \neq 0$ is taken into account.

If the moment of the diffusion coding module does not correspond in terms of its absolute value to the moment of the diffusion decoding module, measures are taken (for example changing the amplitude or duration of the gradients) so that the two moments subsequently correspond in terms of absolute value.

Moreover, the following is noted for all three variants of the present invention.

The user can predetermine the second time interval $t_{P1}$ and the third time interval $t_{P2}$ (as described) in addition to the first time interval $t_F$. Alternatively, (as described) $\delta$, $\Delta$ and $t_{P1}$ or $\delta$, $\Delta$ and $t_{P2}$ can be predetermined, for example. However, the second time interval $t_{P1}$ or, respectively, the third time interval $t_{P2}$ can thereby also be established automatically under optimization criteria.

For example, the third time interval $t_{P2}$ can be permanently selected at zero, such that the diffusion decoding module ends immediately before the beginning of the readout module. It can therefore be achieved that the eddy current fields generated by the last gradient pulse ramp of the diffusion coding module have an optimally similar amplitude during the readout module for different values of the first time interval $t_F$ or, respectively, $\delta$ and $\Delta$. For example, this has advantages if the MR images acquired with different $t_F$ or $\delta$ and $\Delta$ are offset with one another.

Alternatively, $t_{P1}$ can be chosen fixed at zero, such that the diffusion coding module begins immediately after the end of the excitation module. The interval between the last gradient pulse ramp of the diffusion decoding module and the beginning of the readout module is thereby advantageously large, whereby the effects of the associated eddy current fields during the readout process are in turn reduced.

Moreover, in particular for the first variant (spin echo) and for the second variant (stimulated spin echo), the second time interval $t_{P1}$ or, respectively, the third time interval $t_{P2}$ can be selected in order to minimize the absolute value of the time period $t_{shift}$. For example, as a criterion it can be provided that the absolute value $|(t_{prep} + t_{P1} + t_{RFa}) - (t_{adc} + t_{P2} + t_{RFb})|$ is optimally small. $t_{RFa}$ or $t_{RFb}$ designates the duration of the first or last RF module used. Given only one RF pulse (spin echo case) that is used, $t_{RFa} = t_{RFb}$ applies. For example, given defined parameter combinations this method allows a minimization of $t_{shift}$ in the second variant (stimulated spin echo). Moreover, a balancing of the diffusion coding module and the diffusion decoding module can be achieved with this procedure in the first variant (spin echo) given specific parameter combinations, which is advantageous with regard to the dephasings (Maxwell field terms) induced by the transversal components of the magnetic field gradients.

In the present invention, the point in time at which an RF pulse is radiated plays a large role. In the previous Specification it has thereby been assumed that this point in time lies in the middle of the corresponding application module (excitation module, storing module, restoring module or, respectively, refocusing module). Given an asymmetrical application module which can also be used according to the invention in all variants instead of a corresponding symmetrical application module, this point in time or, respectively, action point in time most often does not lie in the temporal middle of the associated application module. Asymmetrical application modules (also known as asymmetrical RF pulses) have a different shape with regard to their amplitude and/or their phase along the two directions of the time axis. Asymmetrical application modules are also present if spoiler gradients which must be assigned to the application module are designed differently before and after the action point in time.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire magnetic resonance (MR) data with diffusion information in a predetermined volume segment of an examination subject, said method comprising:

from a control unit, operating an MR data acquisition unit to excite the volume segment with an excitation module of an MR data acquisition pulse sequence, radiate a diffusion coding module and a subsequent diffusion decoding module of said sequence, radiate at least one radio-frequency (RF) pulse after the excitation module of said sequence, and read out the MR data; and in said control unit, defining at least one parameter in said sequence selected from the group of parameters consisting of a time period ($t_{shift}$), a first time interval ($t_F$), a second time interval ($t_{P1}$) and a third time interval ($t_{P2}$), wherein the time period ($t_{shift}$) defines a time interval between a point in time at which the spin echo condition is satisfied, and the echo time (TE) of the sequence, the first time interval ($t_F$) defines how long a minimum possible time interval between the end of the diffusion coding module and the start of the diffusion decoding module is extended, the second time interval ($t_{P1}$) defines how long a minimum possible time interval between the end of the excitation module and the start of the diffusion coding module is extended, the third time interval ($t_{P2}$) defines how long a minimum possible time interval between the end of the diffusion coding module and the start of the readout of the MR data is extended, the MR data are acquired depending on the at least one parameter ($t_{shift}$, $t_F$, $t_{P1}$, $t_{P2}$), wherein the at least one parameter ($t_{shift}$, $t_F$, $t_{P1}$, $t_{P2}$) is different than 0 s, and a time at which the at least one RF pulse (33; 34, 35) is radiated is determined depending on this at least one parameter ($t_{shift}$, $t_F$, $t_{P1}$, $t_{P2}$).

2. A method as claimed in claim 1, comprising:

in said control unit, defining a coding time ($\delta$) and a diffusion time ($\Delta$), the coding time ($\delta$) corresponding to a duration of the diffusion coding module, and the diffusion time ($\Delta$) corresponding to a duration from the beginning of the diffusion coding module up to the beginning of the diffusion decoding module, with radiated RF pulses being taken into account in the definition of the coding time ($\delta$) and the diffusion time ($\Delta$) in the time period from the beginning of the diffusion coding module up to the beginning of the diffusion decoding module; and in said control unit, executing at least one calculation selected from the group consisting of calculating the first time interval ($t_F$) as a difference of the difference time ($\Delta$) minus the coding time ($\delta$), and calculating a sum of the second time interval ($t_{P1}$) and the third time interval ($t_{P2}$) according to:

$$t_{P1}+t_{P2}=TE-t_{prep}-t_{adc}-\Delta-\delta \quad (G1),$$

wherein TE corresponds to the echo time of the method, $t_{prep}$ corresponds to a duration of the excitation module, and $t_{ads}$ corresponds to a duration which begins with the beginning of the readout module and ends at the end of the echo time (TE) of the method, wherein radiated RF pulses are accordingly taken into account in the definition of the coding time ($\delta$) and the diffusion time ($\Delta$), or in the calculation of the first time interval ($t_F$), or in the calculation of the sum of the second time interval ($t_{P1}$) and the third time interval ($t_{P2}$).

3. A method according to claim 2, comprising:

operating the MR data acquisition unit with the at least one RF pulse including a storing module and a restoring module, and radiating the storing module before the restoring module, and radiating the storing module at a fourth time interval ($t_{R1}$) after the beginning of the excitation module, and radiating the restoring module is radiated at a fifth time interval ($t_{R2}$) after the beginning of the excitation module; and in said control unit, defining the fourth time interval ($t_{R1}$) and the fifth time interval ($t_{R2}$) depending on a duration ($t_{prep}$) of the excitation module, a duration ($t_{RF1}$) of the storing module, a duration ($t_{RF2}$) of the restoring module, a duration ($t_{ads}$) which begins with the beginning of the readout module and ends at the end of the echo time (TE) of the sequence, and the echo time (TE) of the sequence, and additionally depending on at least one of the first time interval ($t_F$) and the second time interval ($t_{P1}$) and the third time interval ($t_{P2}$).

4. A method according to claim 3, comprising:

in said control unit, selecting at least one of the second time interval $t_{P1}$ and the third time interval $t_{P2}$ such that an absolute value B of $$B=|(t_{prep}+t_{P1}+t_{RF1}/2)-(t_{adc}+t_{P2}+t_{RF2}/2)|$$

is minimized.

5. A method according to claim 3, comprising:

in said control unit, determining the fourth time interval ($t_{R1}$) and the fifth time interval ($t_{R2}$) depending on the time period ($t_{shift}$), and such that an absolute value of the time period ($t_{shift}$) is minimized.

6. A method according to claim 3, comprising:

in said control unit, maximizing a portion of the first time interval ($t_F$) that is between the RF pulse of the storing module and the RF pulse of the restoring module.

7. A method according to claim 3, comprising:

in said control unit, determining the fourth time interval ($t_{R1}$) and the fifth time interval ($t_{R2}$) such that the fourth time interval ($t_{R1}$) and the fifth time interval ($t_{R2}$) satisfy the following inequalities:

$$t_{R1} \geq t_{prep}+t_{P1}+t_D/2+t_{RF1}/2$$

$$t_{R2} \leq TE-t_{adc}-t_{P2}-t_D/2-t_{RF2}/2$$

$$t_{R2}-t_{RF2}/2 \geq t_{R1}+t_{RF1}/2.$$

8. A method according to claim 1, comprising:

operating the MR data acquisition unit with the at least one RF pulse in said sequence including a refocusing pulse, radiated at a fourth time interval ($t_R$) after the beginning of the excitation module; and in the control unit, defining the fourth time interval ($t_R$) depending on a duration ($t_{prep}$) of the excitation module, and a duration ($t_{RF}$) of an application module for the refocusing pulse, and a duration ($t_{adc}$) that begins with the beginning of the readout module and ends at the end of the echo time (TE) of the sequence, and the echo time (TE) of the sequence, and the first time interval ($t_F$), and the second time interval ($t_{P1}$) and the third time interval ($t_{P2}$).

9. A method according to claim 8, comprising:

in said control unit, determining a diffusion duration according to:

$$t_{ip}=TE-t_{prep}-t_{P1}-t_F-t_{RF}-t_{P2}-t_{adc}$$

the fourth time interval to be a valid time interval if the fourth time interval satisfies one of the following inequalities $$t_{prep}+t_{RF}/2 \leq t_R \leq t_{prep}+t_{P1}+t_{RF}/2,$$

$$t_{prep}+t_{P1}+t_{RF}/2 \leq t_R \leq t_{prep}+t_{P1}+t_{RF}/2+t_D/2$$

$$t_{prep}+t_{P1}+t_{RF}/2+t_D/2 \leq t_R \leq t_{prep}+t_{P1}+t_{RF}/2+t_D/2+t_F$$

$t_{prep}+t_{P1}+t_{RF}/2+t_D/2+t_F \leq t_R \leq TE-t_{adc}-t_{RF}/2-t_{P2}$ $t_{prep}+t_{P1}+t_{RF}/2+t_D/2+t_F \leq t_R \leq TE-t_{adc}-t_{RF}/2$; and in said control unit, defining the fourth time interval to be equal to half of the echo time (TE) if the fourth time interval equal to half of the echo time (TE) is a valid time interval.

10. A method according to claim 9, comprising:

in the control unit, if the fourth time interval ($t_R$) that is equal to half of the echo time (TE) is not valid time interval, determining the fourth time interval ($t_R$) according to:

$t_R = TE/2 - t_{shift}$.

such that the absolute value of the time period ($t_{shift}$) is a minimum.

11. A method according to claim 1, comprising:

operating the MR data acquisition unit with the at least one RF pulse including a first refocusing pulse and a second refocusing pulse, with the first refocusing module radiating the first refocusing pulse before the second refocusing module radiates the second refocusing pulse, and with the first refocusing module radiated at a fourth time interval ($t_{R1}$) after the beginning of the excitation module, and the second refocusing module is radiated at a fifth time interval ($t_{R2}$) after the beginning of the excitation module; and in said control unit, defining the fourth time interval ($t_{R1}$) and the fifth time interval ($t_{R2}$) depending on a duration ($t_{prep}$) of the excitation module, on a duration ($t_{RF1}$) of the storing module, on a duration ($t_{RF2}$) of the restoring module, on a duration ($t_{adc}$) that begins with the beginning of the readout module and ends at the end of the echo time (TE) of the sequence, on the echo time (TE) of the sequence, and additionally depending on at least one of the first time interval ($t_F$) and the second time interval ($t_{P1}$) and the third time interval ($t_{P2}$).

12. A method according to claim 11, comprising:

in said control unit, defining the fourth time interval ($t_{R1}$) and the fifth time interval ($t_{R2}$) such that $t_{R2} - t_{R1} = (TE - t_{shift})/2$ is satisfied, and insofar as the fourth time interval ($t_{R1}$) and the fifth time interval ($t_{R2}$) are valid time intervals;

in said control unit, defining $t_D$ to be a diffusion duration that is determined by:

$t_D = TE - t_{prep} - t_{P1} - t_{RF1} - t_F - t_{RF2} - t_{P2} - t_{adc}$;

and in said control unit, defining the fourth time interval ($t_{R1}$) and the fifth time interval ($t_{R2}$) to be valid time intervals if the first refocusing module is before the second refocusing module, and if the fourth time interval ($t_{R1}$) and the fifth time interval ($t_{R2}$) satisfy one of the following inequalities:

$t_{R1} \geq t_{prep} + t_{RF1}/2$ and $t_{R2} \leq t_{prep} + t_{P1} + t_{RF1} + t_{RF2}/2$ $t_{prep} + t_{RF1}/2 \leq t_{R1} \leq t_{prep} + t_{P1} + t_{RF1}/2$ and $t_{prep} + t_{P1} + t_{RF1} + t_{RF2}/2 \leq t_{R2} < t_{prep} + t_{P1} + t_{RF1} + t_D/2 + t_{RF2}/2$ $t_{prep} + t_{RF1}/2 \leq t_{R1} \leq t_{prep} + t_{P1} + t_{RF1}/2$ and $t_{prep} + t_{P1} + t_{RF1} + t_D/2 + t_{RF2}/2 \leq t_{R2} < t_{prep} + t_{P1} + t_{RF1} + t_D/2 + t_F + t_{RF2}/2$ $t_{prep} + t_{RF1}/2 \leq t_{R1} \leq t_{prep} + t_{P1} + t_{RF1}/2$ and $t_{prep} + t_{P1} + t_{RF1} + t_D/2 + t_F + t_{RF2}/2 < t_{R2} < t_{prep} + t_{P1} + t_{RF1} + t_F + t_{RF2}/2$ $t_{prep} + t_{RF1}/2 \leq t_{R1} \leq t_{prep} + t_{P1} + t_{RF1}/2$ and $t_{prep} + t_{P1} + t_{RF1} + t_D + t_F + t_{RF2}/2 + t_{R2} < TE - t_{adc} - t_{RF2}/2$ $t_{prep} + t_{P1} + t_D/2 + t_{RF1}/2 \leq t_{R1}$ and $t_{R2} \leq t_{prep} + t_{P1} + t_D/2 + t_{RF1} + t_F + t_{RF2}/2$ $t_{prep} + t_{P1} + t_D/2 + t_{RF1}/2 \leq t_{R1} < t_{prep} + t_{P1} + t_D/2 + t_F + t_{RF1}/2$ and $t_{prep} + t_{P1} + t_D/2 + t_{RF1} + t_F + t_{RF2}/2 < t_{R2} < t_{prep} + t_{P1} + t_D + t_{RF1} + t_F + t_{RF2}/2$ $t_{prep} + t_{P1} + t_D/2 + t_{RF1}/2 \leq t_{R1} \leq t_{prep} + t_{P1} + t_D/2 + t_F + t_{RF1}/2$ and $t_{prep} + t_{P1} + t_D + t_{RF1} + t_F + t_{RF2}/2 \leq t_{R2} \leq TE - t_{adc} + t_{RF2}/2$ and $t_{prep} + t_{P1} + t_D/2 + t_F + t_{RF1}/2 < t_{R1} < t_{prep} + t_{P1} + t_D + t_F + t_{RF1}$ and $t_{prep} + t_{P1} + t_D + t_{RF1} + t_F + t_{RF2}/2 \leq t_{R2} < TE - t_{adc} - t_{RF2}/2$.

13. A method according to claim 12, comprising:

in said control unit, defining the fourth time interval ($t_{R1}$) and/or the fifth time interval ($t_{R2}$) to cause an absolute value of the time period ($t_{shift}$) to be optimally small.

14. A method according to claim 12, comprising:

in said control unit, defining the fourth time interval ($t_{R1}$) to cause eddy current fields that occur due to the diffusion coding module and the diffusion decoding module to be minimized.

15. A method according to claim 14, comprising:

in said control unit, defining the eddy current fields as $B_{EC}(TE)$ depending on the echo time (TE) of the sequence according to $$B_{EC}(TE) = \sum_{i=1}^{n} (\alpha G_i (\exp(-\lambda(TE - T_i)) - \exp(-\lambda(TE - T_i + t_i))))$$

wherein n is the number of gradients of the diffusion coding module and the diffusion decoding module, $G_i$ is an amplitude of the i-th gradient of the diffusion coding module and the diffusion decoding module, $T_i$ is a start point in time of the i-th gradient of the diffusion coding module and the diffusion decoding module, $t_i$ is a duration of i-th gradients of the diffusion coding module and the diffusion decoding module, $\alpha$ and $\lambda$ are scaling constants; and in said control unit, minimizing the eddy current fields by minimizing the absolute value of $B_{EC}(TE)$.

16. A method according to claim 11, comprising:

operating the MR data acquisition unit with gradients generated in the diffusion coding module and the diffusion decoding module, said gradients being generated at at least one predetermined dephasing of all coherence paths, with an exception of a desired double spin echo path.

17. A method according to claim 11, wherein at least one of the second time interval ($t_{P1}$) and the third time interval ($t_{P2}$)

is predetermined, and comprising accessing the at least one predetermined interval in said control unit.

18. A method according to claim 1, comprising:
    operating the MR data acquisition unit to activate, in the diffusion coding module, at least one diffusion gradient pulse, and in the diffusion decoding module, activating at least one diffusion gradient pulse; and
    from said control unit, operating the MR data acquisition unit to cause a pulse moment of the at least one diffusion gradient pulse of the diffusion coding module to have an absolute value to equal to an absolute value of a pulse moment of the at least one diffusion gradient pulse of the diffusion decoding module.

19. A method according to claim 18, wherein said control unit is configured to operate said MR data acquisition unit to execute at least one procedure selected from the group consisting of:
    multiplying an amplitude of the at least one diffusion gradient pulse of the diffusion coding module and/or an amplitude of the at least one diffusion gradient pulse of the diffusion decoding module with a multiplication factor;
    varying a duration of the diffusion coding module while adapting the first time interval ($t_F$);
    varying a duration of the diffusion decoding module while adapting the third time interval ($t_{P2}$); and
    extending a duration of the diffusion decoding module is while adapting the second time interval ($t_{P1}$) and the third time interval ($t_{P2}$).

20. A method according to claim 18, comprising:
    In said control unit, determining said at least one parameter ($t_{shift}$, $t_F$, $t_{P1}$, $t_{P2}$) and additional time specifications ($t_{prep}$, $t_{adc}$, TE, $t_R$, $t_{RF}$, $t_{R1}$, $t_{RF1}$, $t_{R2}$, $t_{RF2}$) are before executing said at least one procedure.

21. A method according to claim 1, comprising:
    in said control unit, setting boundary conditions for a duration ($t_A$) of the diffusion coding module, for a duration ($t_B$) of the diffusion decoding module, and for a time interval between the diffusion coding module and the diffusion decoding module are established based on an echo time (TE), and defining the at least one parameter ($t_{shift}$, $t_F$, $t_{P1}$, $t_{P2}$) is defined depending on these boundary conditions in order to satisfy an optimization criterion.

22. A method according to claim 21, wherein the optimization criterion optimizes at least one criterion selected from the group consisting of:
    minimize the time period ($t_{shift}$);
    minimize eddy fields;
    dephase all coherence paths with the exception of a desired path; and
    maximize a portion of the first time interval ($t_F$) that is between two RF pulses.

23. A magnetic resonance (MR) apparatus, comprising:
    an MR data acquisition unit;
    a control unit configured to operate the MR data acquisition unit to excite the volume segment with an excitation module of an MR data acquisition pulse sequence, radiate a diffusion coding module and a subsequent diffusion decoding module of said sequence, radiate at least one radio-frequency (RF) pulse after the excitation module of said sequence, and read out the MR data; and
    said control unit being configured to define at least one parameter selected from the group of parameters consisting of a time period ($t_{shift}$), a first time interval ($t_F$), a second time interval ($t_{P1}$) and a third time interval ($t_{P2}$), wherein the time period ($t_{shift}$) defines a time interval between a point in time at which the spin echo condition is satisfied, and the echo time (TE) of the sequence, the first time interval ($t_F$) defines how long a minimum possible time interval between the end of the diffusion coding module and the start of the diffusion decoding module is extended, the second time interval ($t_{P1}$) defines how long a minimum possible time interval between the end of the excitation module and the start of the diffusion coding module is extended, the third time interval ($t_{P2}$) defines how long a minimum possible time interval between the end of the diffusion coding module and the start of the readout of the MR data is extended, the MR data are acquired depending on the at least one parameter ($t_{shift}$, $t_F$, $t_{P1}$, $t_{P2}$), wherein the at least one parameter ($t_{shift}$, $t_F$, $t_{P1}$, $t_{P2}$) is different than 0 s, and a time at which the at least one RF pulse (33; 34, 35) is radiated is determined depending on this at least one parameter ($t_{shift}$, $t_F$, $t_{P1}$, $t_{P2}$).

24. A non-transitory, computer-readable data storage medium encoded with programming instructions, said storage medium being loaded into a computerized control and evaluation system of a magnetic resonance (MR) apparatus, but also comprises an MR data acquisition unit, and said programming instructions causing said control and evaluation unit:
    operate the MR data acquisition unit to excite the volume segment with an excitation module of an MR data acquisition pulse sequence, radiate a diffusion coding module and a subsequent diffusion decoding module of said sequence, radiate at least one radio-frequency (RF) pulse after the excitation module of said sequence, and read out the MR data; and
    define at least one parameter in said sequence selected from the group of parameters consisting of a time period ($t_{shift}$), a first time interval ($t_F$), a second time interval ($t_{P1}$) and a third time interval ($t_{P2}$), wherein the time period ($t_{shift}$) defines a time interval between a point in time at which the spin echo condition is satisfied, and the echo time (TE) of the sequence, the first time interval ($t_F$) defines how long a minimum possible time interval between the end of the diffusion coding module and the start of the diffusion decoding module is extended, the second time interval ($t_{P1}$) defines how long a minimum possible time interval between the end of the excitation module and the start of the diffusion coding module is extended, the third time interval ($t_{P2}$) defines how long a minimum possible time interval between the end of the diffusion coding module and the start of the readout of the MR data is extended, the MR data are acquired depending on the at least one parameter ($t_{shift}$, $t_F$, $t_{P1}$, $t_{P2}$), wherein the at least one parameter ($t_{shift}$, $t_F$, $t_{P1}$, $t_{P2}$) is different than 0 s, and a time at which the at least one RF pulse (33; 34, 35) is radiated is determined depending on this at least one parameter ($t_{shift}$, $t_F$, $t_{P1}$, $t_{P2}$).

* * * * *